United States Patent
Kim et al.

(10) Patent No.: US 11,670,700 B2
(45) Date of Patent: Jun. 6, 2023

(54) SEMICONDUCTOR DEVICE

(71) Applicant: SAMSUNG ELECTRONICS CO., LTD., Suwon-si (KR)

(72) Inventors: Young-Kwan Kim, Daejeon (KR); Hyuck Joon Kwon, Yongin-si (KR); Jae Beom Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 39 days.

(21) Appl. No.: 17/211,469

(22) Filed: Mar. 24, 2021

(65) Prior Publication Data

US 2022/0037508 A1 Feb. 3, 2022

(30) Foreign Application Priority Data

Jul. 29, 2020 (KR) ........................ 10-2020-0094189

(51) Int. Cl.
*H01L 29/66* (2006.01)
*H01L 23/544* (2006.01)
(Continued)

(52) U.S. Cl.
CPC ...... *H01L 29/66545* (2013.01); *H01L 23/544* (2013.01); *H01L 27/10823* (2013.01); *H01L 27/10876* (2013.01); *H01L 27/10894* (2013.01); *H01L 27/10897* (2013.01); *H01L 27/1116* (2013.01); *H01L 29/4236* (2013.01); *H01L 27/11548* (2013.01); *H01L 2223/5446* (2013.01)

(58) Field of Classification Search
CPC ......... H01L 27/10897; H01L 27/10876; H01L 27/10894
See application file for complete search history.

(56) References Cited

U.S. PATENT DOCUMENTS 7,541,255 B2   6/2009   Kim et al.
8,878,289 B2   11/2014  Kim
(Continued)

FOREIGN PATENT DOCUMENTS

EP        2246883 A1 *  11/2010  ..... H01L 21/823828
KR   10-2006-0086217    6/2006
(Continued)

OTHER PUBLICATIONS

European Office Action dated Feb. 1, 2022 in corresponding European Patent Application No. 21167388.4 (5 pages).
(Continued)

*Primary Examiner* — Bilkis Jahan
*Assistant Examiner* — Victor V Barzykin
(74) *Attorney, Agent, or Firm* — F. Chau & Associates, LLC

(57) ABSTRACT

A semiconductor memory element is provided. The semiconductor memory element includes a substrate including a memory cell region and a peripheral circuit region, an active region located in the memory cell region, a gate pattern buried in the active region, a conductive line disposed on the gate pattern, a first region including a plurality of peripheral elements placed in the peripheral circuit region, a dummy pattern buried in the peripheral circuit region, and a second region which includes the dummy pattern and does not overlap the first region.

20 Claims, 21 Drawing Sheets

(51) Int. Cl.
  *H10B 12/00* (2023.01)
  *H10B 10/00* (2023.01)
  *H01L 29/423* (2006.01)
  *H01L 27/108* (2006.01)
  *H01L 27/11* (2006.01)
  *H10B 41/50* (2023.01)
  *H01L 27/11548* (2017.01)

(56) References Cited

U.S. PATENT DOCUMENTS

| | | | |
|---|---|---|---|
| 9,136,270 | B2 | 9/2015 | Kim et al. |
| 10,083,968 | B1 | 9/2018 | Nagai |
| 2013/0328160 | A1* | 12/2013 | Ota ..................... H01L 27/04 257/506 |
| 2015/0102395 | A1 | 4/2015 | Park et al. |
| 2016/0336327 | A1* | 11/2016 | Park .................. H01L 27/10876 |
| 2018/0366468 | A1* | 12/2018 | Park .................. H01L 27/10817 |
| 2019/0244960 | A1* | 8/2019 | Park .................. H01L 27/10814 |
| 2021/0399052 | A1* | 12/2021 | Wu ..................... H01L 27/2463 |
| 2022/0139855 | A1* | 5/2022 | Hwang ............. H01L 27/11573 257/314 |
| 2022/0180925 | A1* | 6/2022 | Navarro ............. H01L 45/1675 |
| 2022/0189957 | A1* | 6/2022 | Atanasov ............ G11C 11/4023 |

FOREIGN PATENT DOCUMENTS

| | | |
|---|---|---|
| KR | 10-0611065 | 8/2006 |
| KR | 10-2007-0042318 | 4/2007 |
| KR | 10-0732771 | 6/2007 |
| KR | 10-0861177 | 9/2008 |
| KR | 10-0949901 | 3/2010 |
| KR | 10-2013-0056609 | 5/2013 |

OTHER PUBLICATIONS

European Search Report dated Jan. 20, 2022 in corresponding European Patent Application No. 21167388.4 (5 pages).

* cited by examiner

FIG. 4
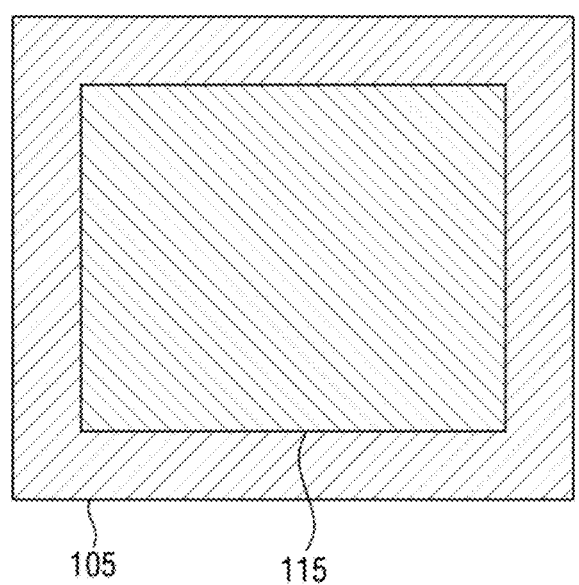
C_R
105  115
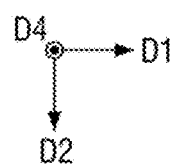
D4 → D1
↓
D2

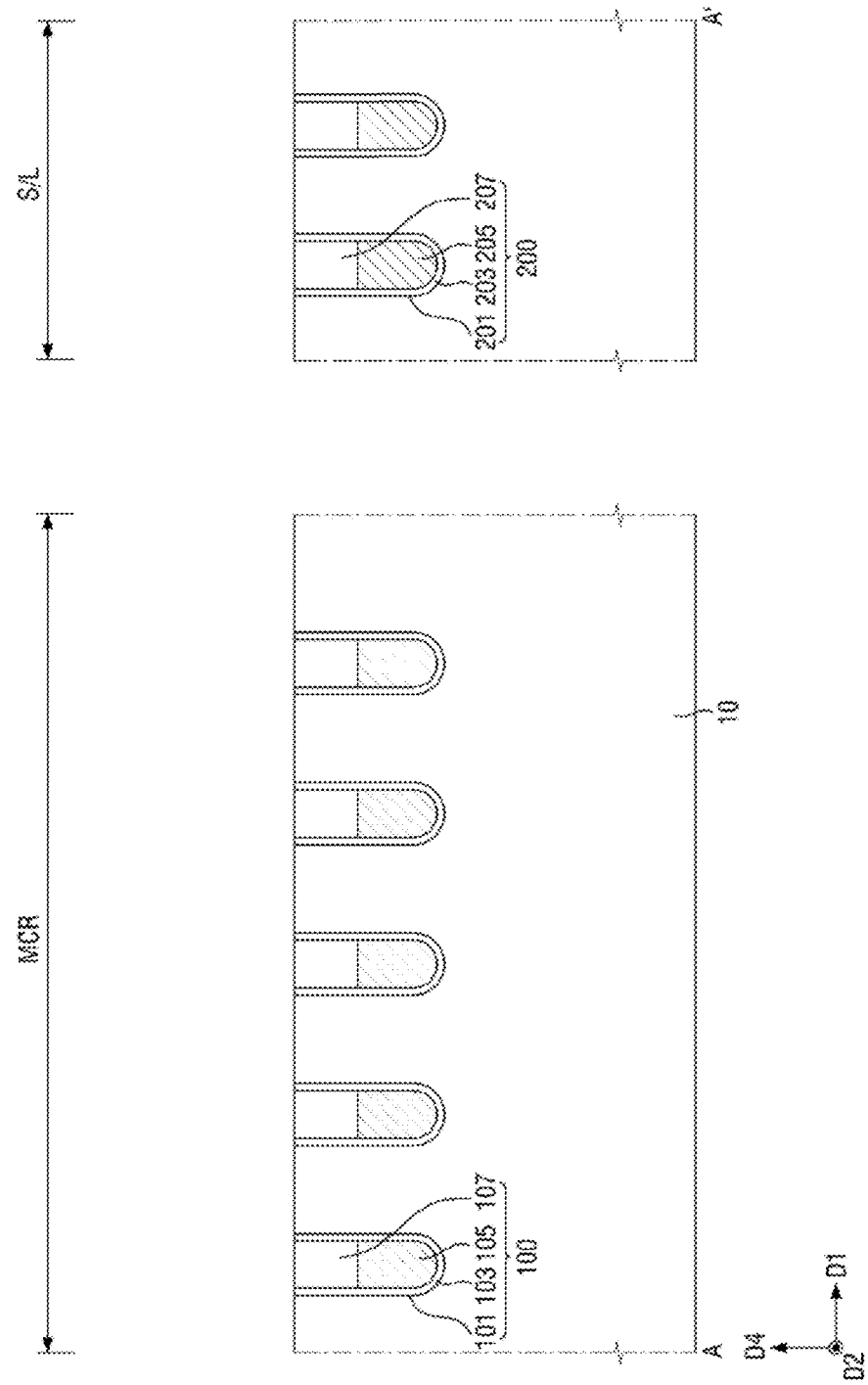

US 11,670,700 B2

SEMICONDUCTOR DEVICE

CROSS-REFERENCE TO RELATED APPLICATION

This application claims the benefit under 35 U.S.C. § 119 of Korean Patent Application No. 10-2020-0094189, filed on Jul. 29, 2020, in the Korean Intellectual Property Office, the disclosure of which is incorporated by reference herein in its entirety.

TECHNICAL FIELD

The present disclosure relates to a semiconductor memory element.

DISCUSSION OF RELATED ART

As semiconductor memory elements gradually become highly integrated, individual circuit patterns are further miniaturized to implement more semiconductor devices in the same area. On the other hand, a buried channel array transistor (BCAT) may minimize a short channel effect by including a gate electrode buried in a trench to secure a sufficient effective channel length. When a plurality of buried gate electrodes of a semiconductor element are formed through a metal etch back process, it may be desirable that the provided structure for etching has good dispersion characteristics in the metal etch back process, so that the buried gate electrodes formed are uniform and accordingly the semiconductor memory element formed is reliable.

SUMMARY

Aspects of the present disclosure provide a semiconductor memory element in which metal etch back (MEB) dispersion characteristics of gate patterns of a memory cell region are enhanced by forming a dummy pattern including a buried channel array transistor (BCAT) in a peripheral circuit region.

Aspects of the present disclosure also provide a method for fabricating a semiconductor memory element in which metal etch back (MEB) dispersion characteristics of gate patterns of a memory cell region are enhanced by forming a dummy pattern including a buried channel array transistor (BCAT) in a peripheral circuit region.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided a semiconductor memory element, including a substrate including a memory cell region and a peripheral circuit region, an active region located in the memory cell region, a gate pattern buried in the active region, a conductive line disposed on the gate pattern, a first region including a plurality of peripheral elements placed in the peripheral circuit region, a dummy pattern buried in the peripheral circuit region, and a second region which includes the dummy pattern and does not overlap the first region.

According to an embodiment of the present disclosure, a semiconductor memory element includes a substrate which includes a memory cell region including a plurality of gate trenches, and a peripheral circuit region including a plurality of dummy trenches, a plurality of peripheral elements which are placed in the peripheral circuit region and do not overlap the plurality of dummy trenches, a plurality of gate patterns formed by filling the plurality of gate trenches with a metal material, and a plurality of dummy patterns formed by filling the plurality of dummy trenches with the metal material, in which lengths which are each from a bottom to a top of a structure formed of the metal material within the gate patterns in a first direction are the same, and the dummy patterns are floating.

According to an embodiment of the present disclosure, a semiconductor memory element includes a memory cell region including gate recesses placed continuously in a first direction, a peripheral circuit region including a dummy pattern region including a plurality of trenches placed continuously in the first direction, a plurality of peripheral elements placed in the peripheral circuit region, gate insulating films formed on the gate recesses and the trenches, gate patterns formed by forming a conductive material on the gate insulating films and filling the gate recesses, and dummy patterns formed by forming the conductive material on the gate insulating films and filling the plurality of trenches, in which the gate patterns are connected to a conductive line, the dummy patterns are floating, and the dummy pattern region is placed apart from the memory cell region in the first direction.

Other features and embodiments may be apparent from the following detailed description, the drawings, and the claims.

BRIEF DESCRIPTION OF THE DRAWINGS

The above and other aspects and features of the present disclosure will become more apparent by describing in detail embodiments thereof with reference to the accompanying drawings, in which:

FIG. 4 is an exemplary enlarged view showing the enlarged contact region C_R of FIG. 3;

FIG. 21 is an exemplary cross-sectional view showing a cross section taken along line A-A' of FIG. 20.

Figure 1:
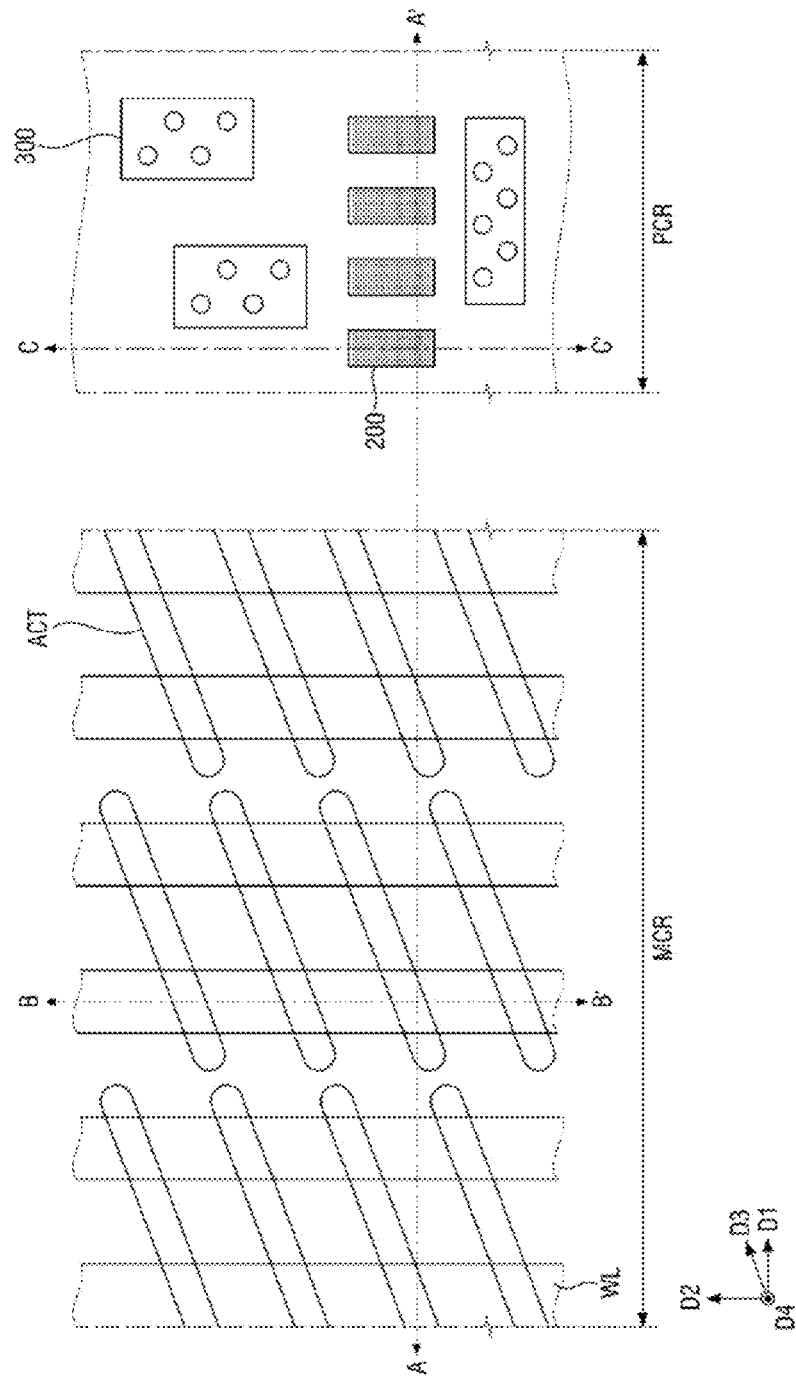
FIG. 1 is an exemplary diagram showing a memory cell region and a peripheral circuit region of the semiconductor memory element according to an embodiment of the present disclosure.

Since the drawings in FIGS. 1-21 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, the semiconductor memory element according to embodiments of the present disclosure will be described referring to FIGS. 1 to 21. Although a DRAM (dynamic random access memory) has been shown as an example of the semiconductor memory element according to an embodiment of the present disclosure, the present disclosure is not limited thereto. For example, the semiconductor memory element may be a static RAM (SRAM).

Figure 2:
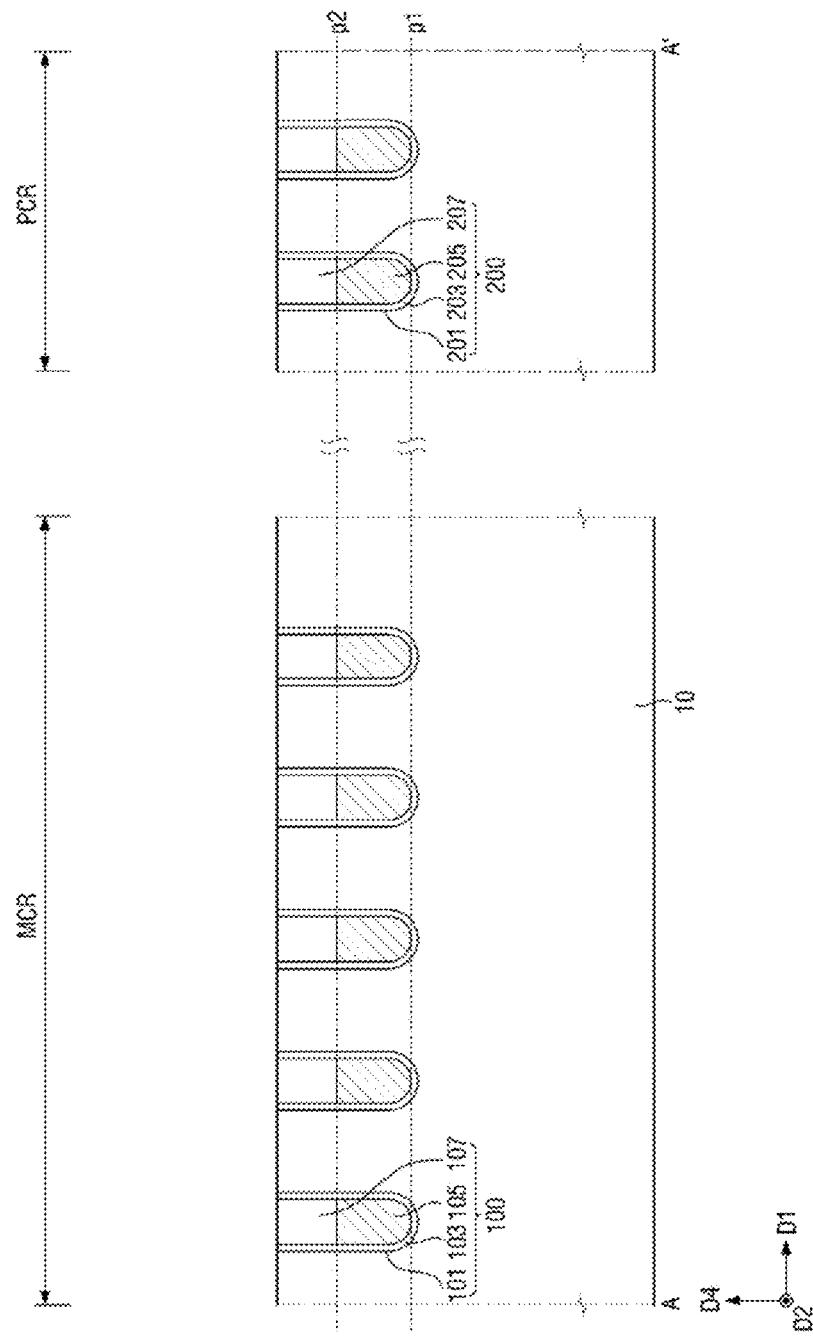
FIG. 2 is an exemplary cross-sectional view showing a cross section taken along line A-A' of FIG. 1.
Figure 3:
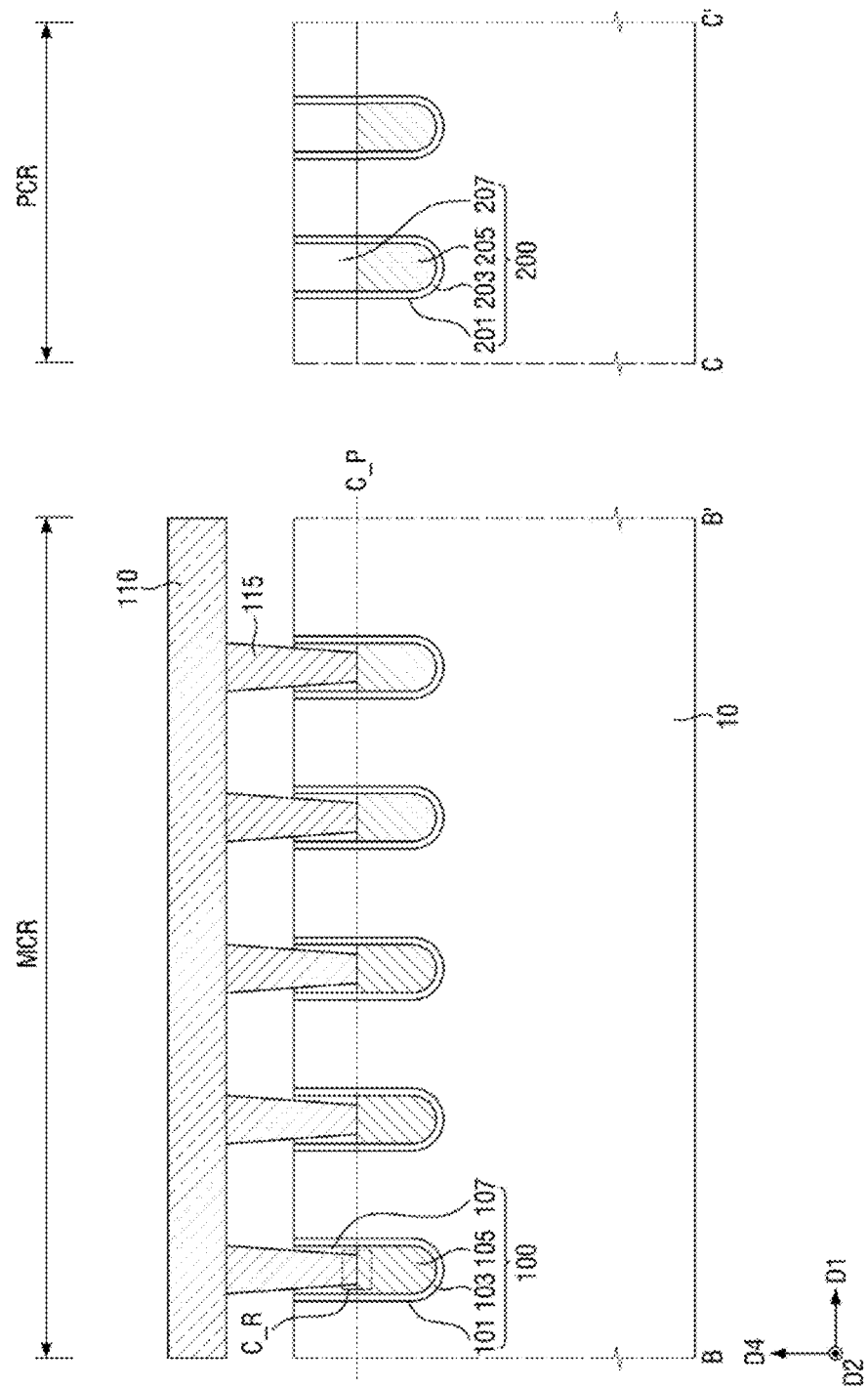
FIG. 3 is an exemplary cross-sectional view showing cross sections taken along lines B-B' and C-C' of FIG. 1.

FIG. 1 is an exemplary diagram showing a memory cell region and a peripheral circuit region of the semiconductor memory element according to an embodiment of the present disclosure. FIG. 2 is an exemplary cross-sectional view showing a cross section taken along line A-A' of FIG. 1. FIG. 3 is an exemplary cross-sectional view showing cross sections taken along lines B-B' and C-C' of FIG. 1.

Referring to FIGS. 1 to 3, the semiconductor memory element according to an embodiment of the present disclosure may include a substrate 10, a memory cell region MCR on the substrate 10, and a peripheral circuit region PCR on the substrate 10.

For reference, a cell boundary region along the periphery of the memory cell region MCR may be formed in the substrate 10 between the memory cell region MCR and the peripheral circuit region PCR to separate the memory cell region MCR and the peripheral circuit region PCR.

The substrate 10 may include the memory cell region MCR. The memory cell region MCR may include a plurality of active regions ACT. The active regions ACT may be defined by an element separation film formed inside the substrate 10. For example, the active regions ACT may correspond to portions of the substrate 10 that are surrounded by device isolation patterns. As shown in FIG. 1, with a decrease in design rule of the semiconductor memory element, the active regions ACT may each be an isolated shape and placed in the form of a bar of a diagonal line or an oblique line. For example, the active regions ACT may extend in a third direction D3, and may be arranged in parallel to each other.

Gate patterns 100 may be placed to extend in a second direction D2 across the active regions ACT. The gate patterns 100 may extend parallel to each other. The gate patterns 100 may be, for example, a plurality of word lines WL. The word lines WL may be placed at equal intervals in a first direction D1. Each of the word lines WL may have a curved bottom surface. In an embodiment of the present disclosure, one active region ACT may be crossed by a pair of word lines WL. A width of the word line WL or an interval between the word lines WL may be determined depending on the design rules.

For reference, for convenience of explanation, a storage connection region, a bit line connection region and a plurality of bit lines BL included in the active region ACT, and a direct contact DC, a buried contact BC and a landing pad LP connected to a plurality of bit lines will be omitted in all explanations below.

The word line WL or the gate pattern 100 may be formed as a structure buried inside the substrate 10. For example, as the semiconductor memory element is highly integrated, a pattern line width and an interval of cell transistors constituting the semiconductor memory element become remarkably small, and the channel length of the transistor is gradually reduced accordingly. When the channel length of the transistor becomes smaller than an effective channel length required for the operation of the transistor, the electrical characteristics of the transistor may be significantly degraded due to a short channel effect. For example, the short channel effect may cause the generation of a leakage current. To prevent this problem, as shown in FIGS. 2 and 3, a structure such as a recessed channel type transistor or a buried channel array transistor (BCAT) having a gate pattern 100 or a word line WL buried inside the substrate 10 may be formed in the memory cell region MCR to ensure a sufficient effective channel length. The BCAT may provide better leakage current characteristics, such as GIDL (gate induced drain leakage) compared to a conventional transistor. The word line WL may have an angle of less than 90 degrees with the active region ACT.

The substrate 10 may be bulk silicon (Si) or an SOI (silicon-on-insulator). In contrast, the substrate 10 may be a silicon substrate or may include, but is not limited to, other materials, for example, silicon germanium (SiGe), SGOI (silicon germanium on insulator), indium antimonide (InSb), lead tellurium (PbTe) compounds, indium arsenide (InAs), indium phosphide (InP), gallium arsenide (GaAs) or gallium antimonide (GaSb). In addition, the substrate 10 may include one or more semiconductor layers or structures and may include active or operable portions of semiconductor devices. In the following explanation, the substrate 10 will be explained as a silicon substrate.

For reference, for convenience of explanation, in all the following explanations below, although the substrate may include at least one of a silicon oxide ($SiO_2$) film, a silicon nitride ($Si_3N_4$) film or a silicon oxynitride (SiON) film, for example, formed as an element separation film, the element separation film not limited thereto will be omitted.

The gate pattern 100 may be formed on the substrate 10, and may be formed across the active region ACT. One gate pattern 100 may include a gate trench 101 (or may be referred to as a gate recess 101, and hereinafter, it will be described and explained as a gate trench) formed in the substrate 10, a gate insulating film 103, a gate electrode 105 (may be referred to as a conductive material 105 or a metallic material 105, and hereinafter, it will be described and explained as a gate electrode), and a gate capping pattern 107. For example, the gate electrode 105 may be a structure formed of a conductive material or a metal material. Here, the gate electrode 105 may correspond to the word line WL.

The gate insulating film 103 may extend along the side walls and bottom surface of the gate trench 101, and may extend along a profile of at least a part of the gate trench 101.

The gate electrode 105 may be formed on the gate insulating film 103, and may fill a part of the gate trench 101. Thus, the gate insulating film 103 may be disposed between the gate electrode 105 and an inner surface of the gate trench 101.

The substrate 10 may include a peripheral circuit region PCR. The peripheral circuit region PCR may be placed on the substrate 10 to be spaced apart from the memory cell region MCR in the first direction D1. However, the present disclosure is not limited thereto. For example, the peripheral circuit region PCR may also be placed on the substrate 10 to be spaced apart from the memory cell region MCR in various other directions (e.g., the third direction D3).

The peripheral circuit region PCR may include a first region including a plurality of peripheral elements 300, and a second region including a dummy pattern 200. The second region may also be referred to as a dummy pattern region. The plurality of peripheral elements 300 may be, for example, various elements that transmit and receive electrical signals to and from the memory cells formed in the memory cell region MCR. Thus, the plurality of peripheral elements 300 may include various elements having different structures, shapes and sizes to perform different functions. For example, although the plurality of peripheral elements 300 may include a page buffer component element, a row decoder component element, a column decoder component element, or the like, the plurality of peripheral elements 300 is not limited thereto.

In the peripheral circuit region PCR, a space other than the first region including the plurality of peripheral elements 300 and the second region including the dummy pattern 200 may be formed. Or, in the peripheral circuit region PCR, the remaining region except the first region including the plurality of peripheral elements 300 may be filled with the second region including the dummy pattern 200. That is, the first region including the plurality of peripheral elements 300 and the second region including the dummy pattern 200 do not overlap each other.

The shapes of the plurality of peripheral elements 300 and the shape of the dummy pattern 200 as viewed in a fourth direction D4 are not limited to FIG. 1, but may be various shapes. For example, the plurality of peripheral elements 300 and the dummy pattern 200 may have shapes different from each other, or may have the same shape but with sizes different from each other. Further, the arrangement of the dummy patterns 200 as viewed in the fourth direction D4 is not limited to FIG. 1, and may be randomly placed at various positions in various shapes. In an embodiment of the present disclosure, the shapes of the dummy pattern 200 may include, but are not limited to: a circular shape, an elliptical shape, a triangular shape, a rhombus shape, a square shape, a rectangular shape, a linear shape and a polygonal shape. The dummy patterns 200 may be arranged linearly or in a zig-zag fashion in the first direction D1. Large portion of the peripheral circuit region PCR may be occupied by the dummy patterns 200. For example, in the peripheral circuit region PCR as viewed in the fourth direction D4, the second portion including the dummy pattern 200 may occupy 100%, 90%, 80% or the like for the remaining portion except the first region including the plurality of peripheral elements 300. That is, for example, the area occupied by the first region including the plurality of peripheral elements 300 in the peripheral circuit region PCR when viewed in the fourth direction D4 may be smaller than the area occupied by the second region including the dummy pattern 200 in the peripheral circuit region PCR when viewed in the fourth direction D4. For example, the area of the second region may be larger than the area of the first region.

The dummy pattern 200 may be formed as a structure buried in the substrate 10. For example, as shown in FIGS. 2 and 3, a structure such as a buried channel array transistor (BCAT) in which the recessed type of dummy pattern 200 is buried inside the substrate 10 may be formed in the peripheral circuit region PCR. For example, while a gate pattern 100 or a word line WL buried inside the substrate 10 is formed in the memory cell region MCR, the dummy pattern 200 buried inside the substrate 10 may be formed simultaneously in the peripheral circuit region PCR.

The dummy pattern 200 may be formed on the substrate 10. One dummy pattern 200 may include a dummy trench 201 (or may be referred to as a trench 201, and hereinafter, it will be described and explained as the dummy trench) formed in the substrate 10, a gate insulating film 203, a gate electrode 205 (may be referred to as a conductive material 205 or a metallic material 205, and hereinafter, it will be described and explained as a gate electrode), and a gate capping pattern 207. For example, the gate electrode 205 may be a structure formed of a conductive material or a metal material. The gate electrode 205 of the dummy pattern 200 according to an embodiment of the present disclosure is in an electrically floating state. A conductive line 110 may be disposed on the gate pattern 100. For example, the gate electrodes 105 of the gate patterns in the memory cell region MCR according to an embodiment of the present disclosure may be electrically connected to the conductive line 110 through the conductive vias 115 to receive an electrical signal. However, the gate electrodes 205 of the peripheral circuit region PCR according to an embodiment of the present disclosure may remain in a floating state without an electrically connected target. Since the second region in the peripheral circuit region PCR includes the dummy pattern 200 which is in a floating state, the second region may be floating. In other words, the gate electrodes 205 of the dummy patterns 200 in the second region may not be connected electrically.

The gate insulating film 203 may extend along the side walls and bottom surface of the dummy trench 201, and may extend along a profile of at least a part of the dummy trench 201.

The gate insulating films 103 and 203 may include, for example, silicon oxide ($SiO_2$), silicon nitride ($Si_3N_4$), silicon oxynitride (SiON), or a high-dielectric constant material having a dielectric constant higher than that of silicon oxide ($SiO_2$). The high-dielectric constant material may include, for example, at least one of hafnium oxide ($HfO_2$), hafnium silicon oxide ($HfSiO_4$), hafnium-zirconium oxide ($HfZrO_4$), hafnium-tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), lithium oxide ($Li_2O$), aluminum oxide ($Al_2O_3$), lead scandium tantalum oxide ($Pb(Sc,Ta)O_3$), lead zinc niobate [$Pb(Zn_{1/3}Nb_{2/3})O_3$], or combinations thereof.

The gate electrode 205 may be formed on the gate insulating film 203, and may fill a part of the dummy trench 201.

The gate electrodes 105 and 205 may include, for example, at least one of polysilicone (p-Si), titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten (W), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof.

The gate capping patterns 107 and 207 may include, for example, at least one of silicon nitride ($Si_3N_4$), silicon oxynitride (SiON), silicon oxide ($SiO_2$), silicon carbonitride (SiCN), silicon oxycarbonitride (SiOCN) or combinations thereof.

Since a dummy pattern 200 is formed in the peripheral circuit region PCR of the semiconductor memory element according to an embodiment of the present disclosure, metal etch back (MEB) dispersion characteristics of the gate patterns 100 of the memory cell region MCR of the semiconductor memory element according to an embodiment of the present disclosure can be enhanced.

In more details, the distribution of the gate electrodes 105 constituting the gate patterns 100 of the memory cell region MCR may be constant. That is, lengths, which are each from a lowest end p1 to an uppermost part p2 of the gate electrode 105 in the fourth direction D4, may be formed to be the same. As illustrated in FIG. 2, p1 may represent a level of the lowest end of the gate electrode 105 in the fourth direction D4, and p2 may represent a level of an uppermost part of the gate electrode 105 in the fourth direction D4. Accordingly, the heights, which are each in the fourth direction D4 of a contact point C_P on which the gate electrode 105 of the gate pattern 100 of the memory cell region MCR is in contact with the conductive via 115, may be the same. As illustrated in FIG. 3, C_P may represent a level of the contact point between the gate electrode 105 and the conductive via 115. The contact point C_P may mean the contact point at the C_P level. For example, five contact points shown in FIG. 3 as an example may have the same height at the C_P level. For example, enhanced metal etch back dispersion characteristics of the gate electrodes 105 in the gate patterns 100 of the memory cell region MCR may be obtained. As a result, since contact areas of contact regions C_R in which the gate electrodes 105 and the conductive vias 115 are respectively in contact with each other are made to be the same, a uniform resistance distribution of the conductive vias 115 of the gate patterns 100 in the memory cell region MCR may be obtained. For example, five contact areas shown in FIG. 3 as an example may have the same size. This will be explained in detail through FIG. 4.

FIG. 4 is an exemplary enlarged view showing the enlarged contact region C_R of FIG. 3.

Referring to FIGS. 3 and 4, the area of the portion in which the gate electrode 105 and the conductive via 115 are in contact with each other may be an area as viewed in the fourth direction D4 of the conductive via 115 at the contact point C_P. That is, the contact areas of the conductive vias 115 with the gate electrodes 105 at the contact points C_P as viewed in the fourth direction D4 may have the same distribution in the gate patterns 100. In other words, the contact areas between the conductive vias 115 and the gate electrodes 105 may have the same size. For example, by setting a uniform contact area distribution of the contact regions C_R in which the gate electrodes 105 in the gate patterns 100 and the conductive vias 115 are respectively in contact with each other, a uniform resistance distribution of the gate patterns 100 in the memory cell region MCR with respect to the conductive vias 115 may be obtained.

A method for fabricating the semiconductor memory element according to an embodiment of the present disclosure will be explained with reference to FIGS. 5 to 9 below. For the sake of simplification of explanation, an intermediate step of the method for fabricating the semiconductor memory element according to an embodiment of the present disclosure will be explained. Hereinafter, repeated explanation of the aforementioned contents will not be provided.

FIGS. 5 to 9 are intermediate step diagrams for explaining the method for fabricating the semiconductor memory element according to an embodiment of the present disclosure.

Figure 5:
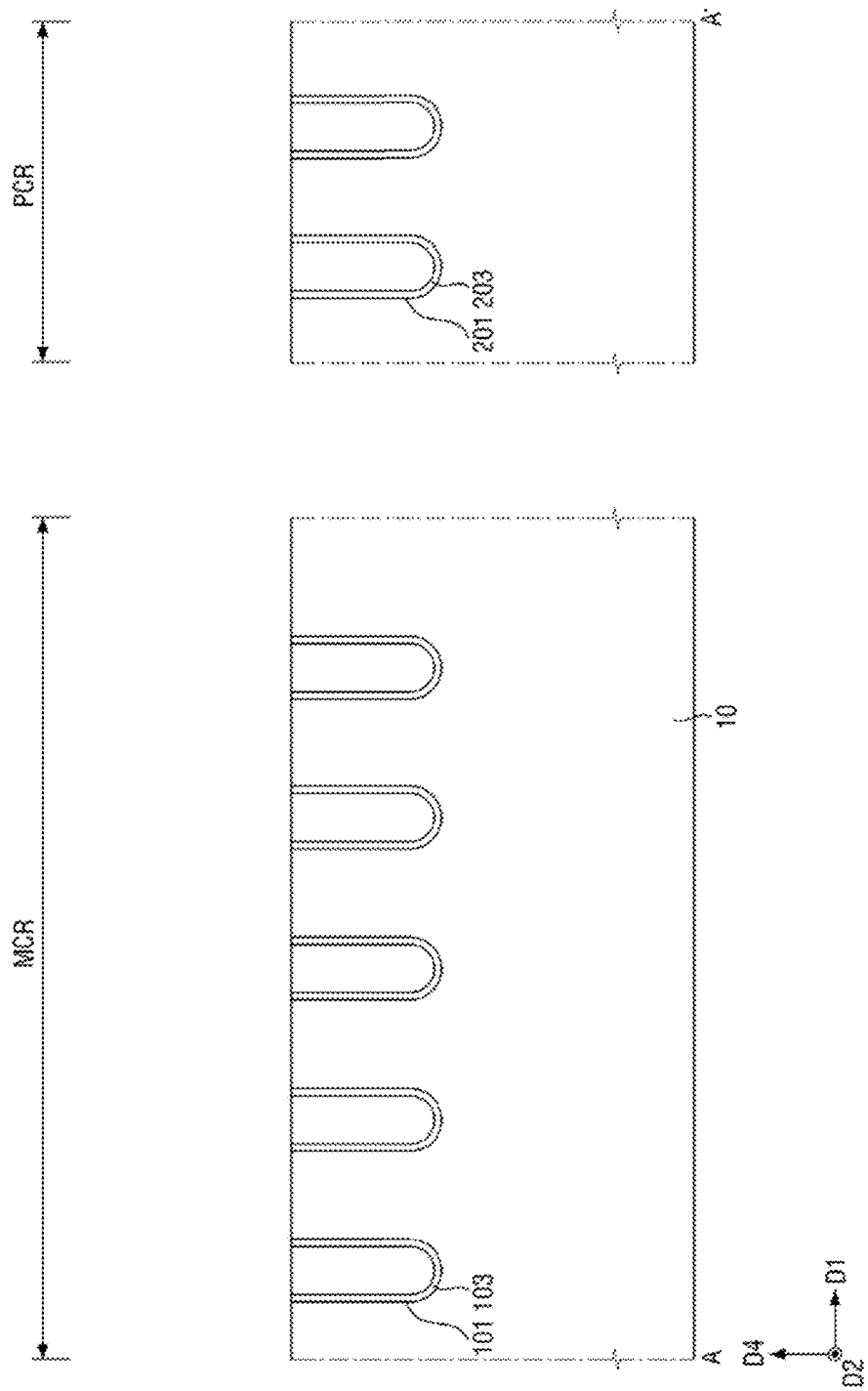
FIGS. 5 to 9 are intermediate step diagrams for explaining the method for fabricating the semiconductor memory element according to an embodiment of the present disclosure.

Referring to FIGS. 2 and 5, a plurality of gate recesses 101 are formed in the memory cell region MCR over the substrate 10. Each of the plurality of gate recesses 101 may be sequentially formed to be spaced apart from each other along the first direction D1. Five gate recesses 101 are shown in FIG. 5 as an example. The number and interval of a plurality of gate recesses 101 formed in the memory cell region MCR on the substrate 10 are not limited thereto.

A plurality of trenches 201 are formed in the peripheral circuit region PCR over the substrate 10. Each of the plurality of trenches 201 may be sequentially formed to be spaced apart from each other along the first direction Dl. Two trenches 201 are shown in FIG. 5 as an example. The number and interval of the plurality of trenches 201 formed in the peripheral circuit region PCR on the substrate 10 are not limited thereto. The shapes and sizes of the gate recesses 101 and the shapes and the sizes of the trenches 201 are shown to be the same in FIG. 5, but the present disclosure is not limited thereto. For example, the gate recesses 101 and the trenches 201 may have shapes different from each other, or may have the same shape but with sizes different from each other.

A gate insulating film 103 is formed on the plurality of gate recesses 101 formed in the memory cell region MCR on the substrate 10. For reference, before forming the gate insulating film 103 on the plurality of gate recesses 101, to prevent deterioration of step coverage of the gate insulating film 103 formed on the inner walls of the plurality of gate recesses 101, after a thermal oxide film is formed, the gate insulating film 103 may be formed. Alternatively, the gate insulating film 103 may be formed by, for example, a chemical vapor deposition (CVD) process, and/or an atomic layer deposition (ALD) process. The gate insulating film 103 may be formed along the side walls of the plurality of gate recesses 101 in a conformal manner.

The gate insulating film 203 is formed on the plurality of trenches 201 formed in the peripheral circuit region PCR on the substrate 10. For reference, before forming the gate insulating film 203 on the plurality of trenches 201, to prevent deterioration of the step coverage of the gate insulating film 203 formed on the inner walls of the plurality of trenches 201, after forming a thermal oxide film, the gate insulating film 203 may be formed. Alternatively, the gate insulating film 203 may be formed by, for example, a chemical vapor deposition (CVD) process, and/or an atomic layer deposition (ALD) process. The gate insulating film 203 may be formed along the side walls of the plurality of trenches 201 in a conformal manner.

Since the gate insulating films 103 and 203 may be formed at the same time and the materials of the gate insulating films 103 and 203 are as explained in FIGS. 1 to 3, detailed description thereof will not be provided. In an embodiment of the present disclosure, the gate insulating films 103 and 203 may include middle temperature or high temperature vapor-deposited silicon oxide ($SiO_2$) film or a high density plasma chemical vapor deposition (HDPCVD) deposited silicon oxide ($SiO_2$) film.

Figure 6:
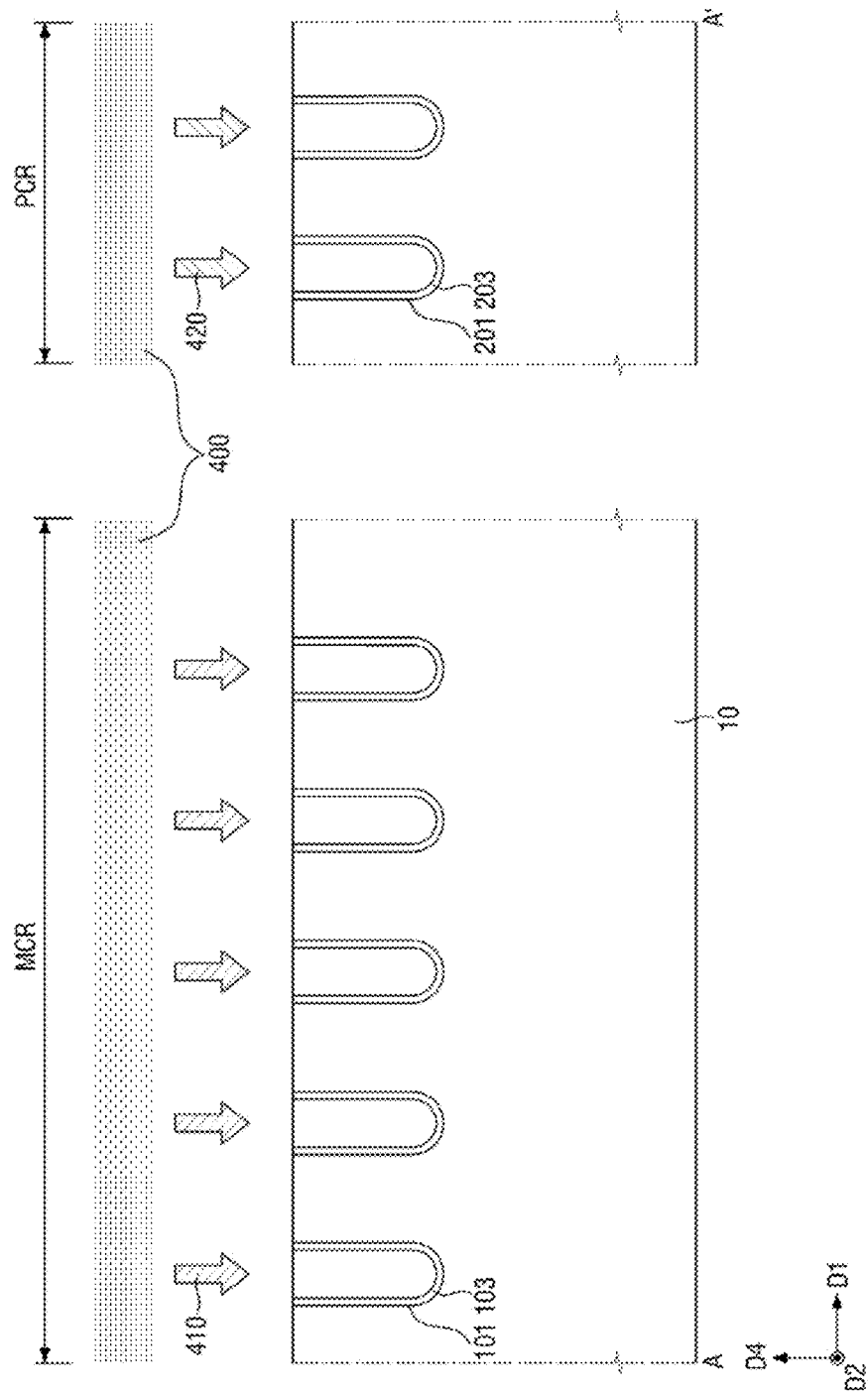
Figure 7:
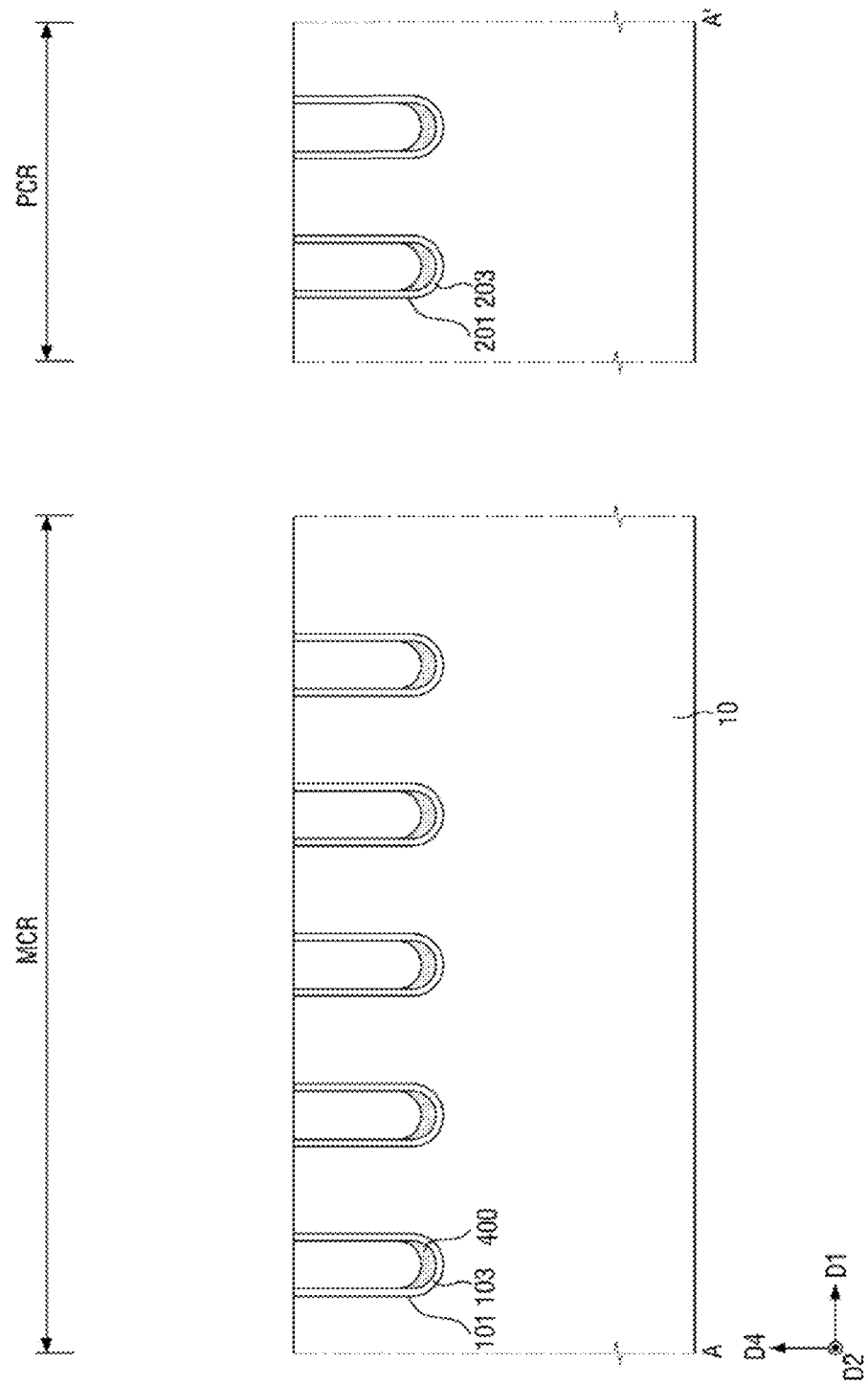

Next, referring to FIGS. 2, 6 and 7, a conductive material is formed on the gate insulating films 103 and 203. For example, a conductive material (or a metal material) nucleation gas 400 is injected into the memory cell region MCR and the peripheral circuit region PCR on the substrate 10. The conductive material nucleation gas 400 may be a nucleation gas for depositing the materials constituting the gate electrodes 105 and 205 described in FIGS. 1 to 3. The nucleation gas is a gas that facilitates subsequent formation of a bulk conductive material, and may be formed on the gate insulating films 103 and 203 in a conformal manner. Hereinafter, the explanation will be made on the assumption that the conductive material constituting the gate electrodes 105 and 205 is tungsten (W).

The nucleation tungsten (W) gas 400 is injected into the memory cell region MCR and peripheral circuit region PCR on the substrate 10. In an embodiment of the present disclosure, the nucleation tungsten (W) gas 400 may include a gas mixture of tungsten hexafluoride ($WF_6$) and silane ($SiH_4$) to form the initial layer of tungsten (W) which serves as a seed or nucleation layer. However, the present disclosure is not limited thereto. For example, the nucleation tungsten (W) gas 400 may include one or more of various tungsten-containing gases such as, for example, tungsten hexafluoride ($WF_6$), tungsten hexachloride ($WCl_6$), and tungsten hexacarbonyl ($W(CO)_6$), and one or more of various reducing agents such as, for example, hydrogen ($H_2$), silane ($SiH_4$), disilane ($Si_2H_6$) hydrazine ($N_2H_4$), diborane ($B_2H_6$) and germane ($GeH_4$). The nucleation tungsten (W) gas 400 may be injected (410) into the memory cell region MCR along the fourth direction D4. Also, the nucleation tungsten (W) gas 400 may be injected (420) into the peripheral circuit region PCR along the fourth direction D4. The nucleation tungsten (W) gas 400 injected along the respective injection directions 410 and 420 may be deposited on the respective gate insulating films 103 and 203.

The nucleation gas 400 for forming the aforementioned conductive material may be deposited on the gate insulating films 103 and 203, for example, through an atomic layer deposition method (ALD). The method for depositing the nucleation gas 400 is not limited thereto. For example, the nucleation gas 400 for forming the aforementioned conductive material may be deposited on the gate insulating films 103 and 203 through a chemical vapor deposition (CVD) process.

Since a trench 201 is also formed in the peripheral circuit region PCR of the semiconductor memory device according to an embodiment of the present disclosure, the nucleation gas 400 injected onto the substrate 10 may be injected into the trench 201. That is, when the trench 201 is not formed in the peripheral circuit region PCR, only the gate recess 101 of the memory cell region MCR exists in a space into which the nucleation gas 400 injected onto the peripheral circuit region PCR may be injected. Thus, the excess nucleation gas 400 may flow from the peripheral circuit region PCR to the memory cell region MCR. Therefore, because the nucleation gas 400 injected onto the peripheral circuit region PCR is injected into the gate recess 101 of the nearest memory cell region MCR into which the nucleation gas 400 may be injected, the thickness of the nucleation layer 400 formed in each of the gate recesses 101 of the memory cell region MCR may not be uniform. This will be explained with reference to FIGS. 10 to 18 later.

In the semiconductor memory element according to an embodiment of the present disclosure, because the trench 201 is also formed in the peripheral circuit region PCR, the nucleation gas 400 injected onto the substrate 10 is also injected into the trench 201, the nucleation gas formed in the gate recess 101 of the memory cell region MCR may have a uniform distribution. For example, the trench 201 formed in the peripheral circuit region PCR may allow the nucleation gas 400 injected onto the substrate 10 to stay in the peripheral circuit region PCR, and may prevent the nucleation gas 400 from flowing to the memory cell region MCR.

Figure 8:
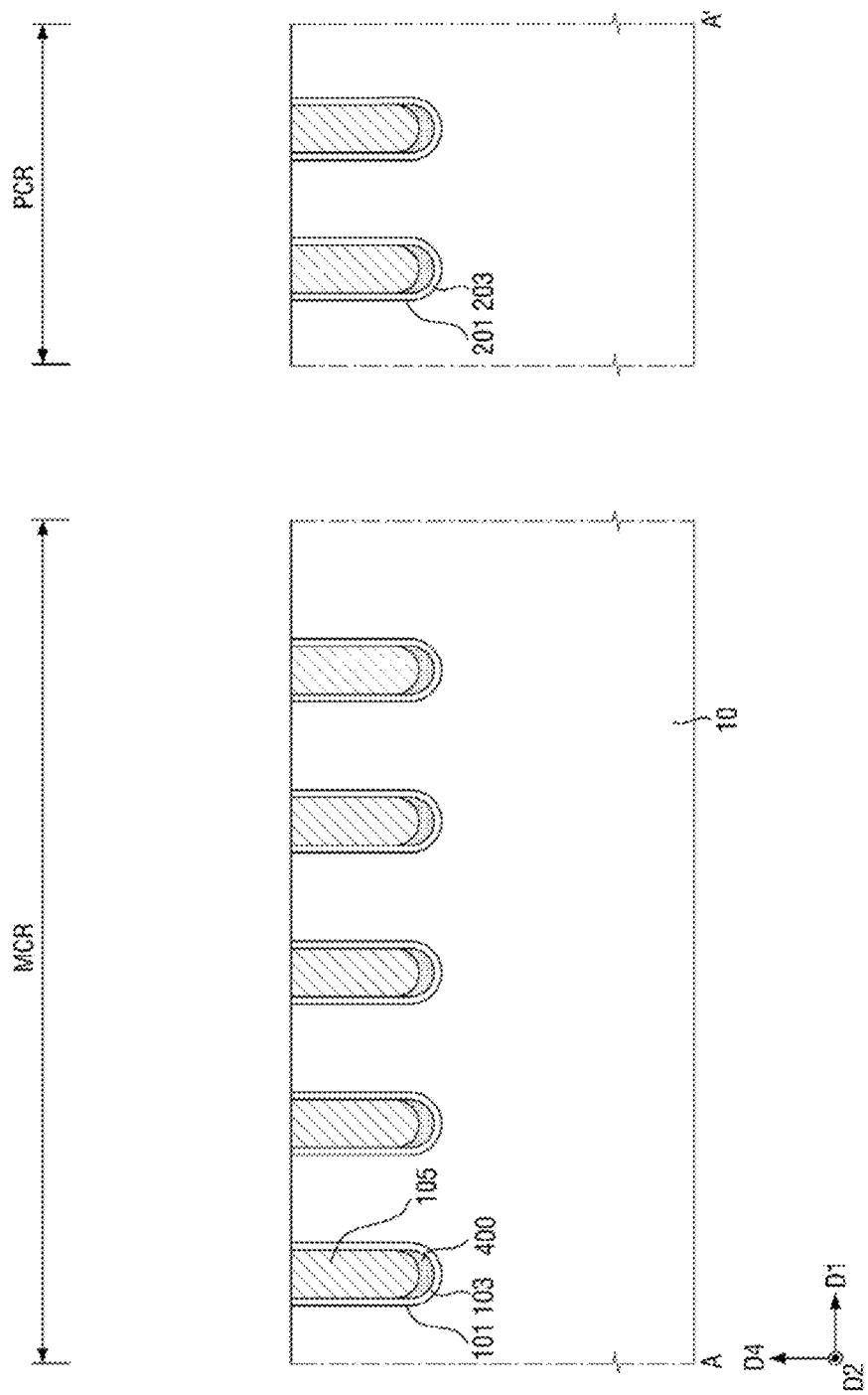

Next, referring to FIGS. 2 and 8, bulk tungsten (W) 105 and 205, that is, gate electrodes 105 and 205 are generated through the nucleation tungsten (W) gas 400. For example, bulk tungsten (W) may be deposited as the bulk tungsten (W) 105 and 205 through a CVD process, by reducing tungsten hexafluorolide ($WF_6$) using a reducing agent such as hydrogen ($H_2$). In an embodiment of the present disclosure, a gas mixture of tungsten hexafluoride ($WF_6$) and hydrogen ($H_2$) may be used to form the tungsten (W) bulk layer on the tungsten (W) nucleation layer.

Figure 9:
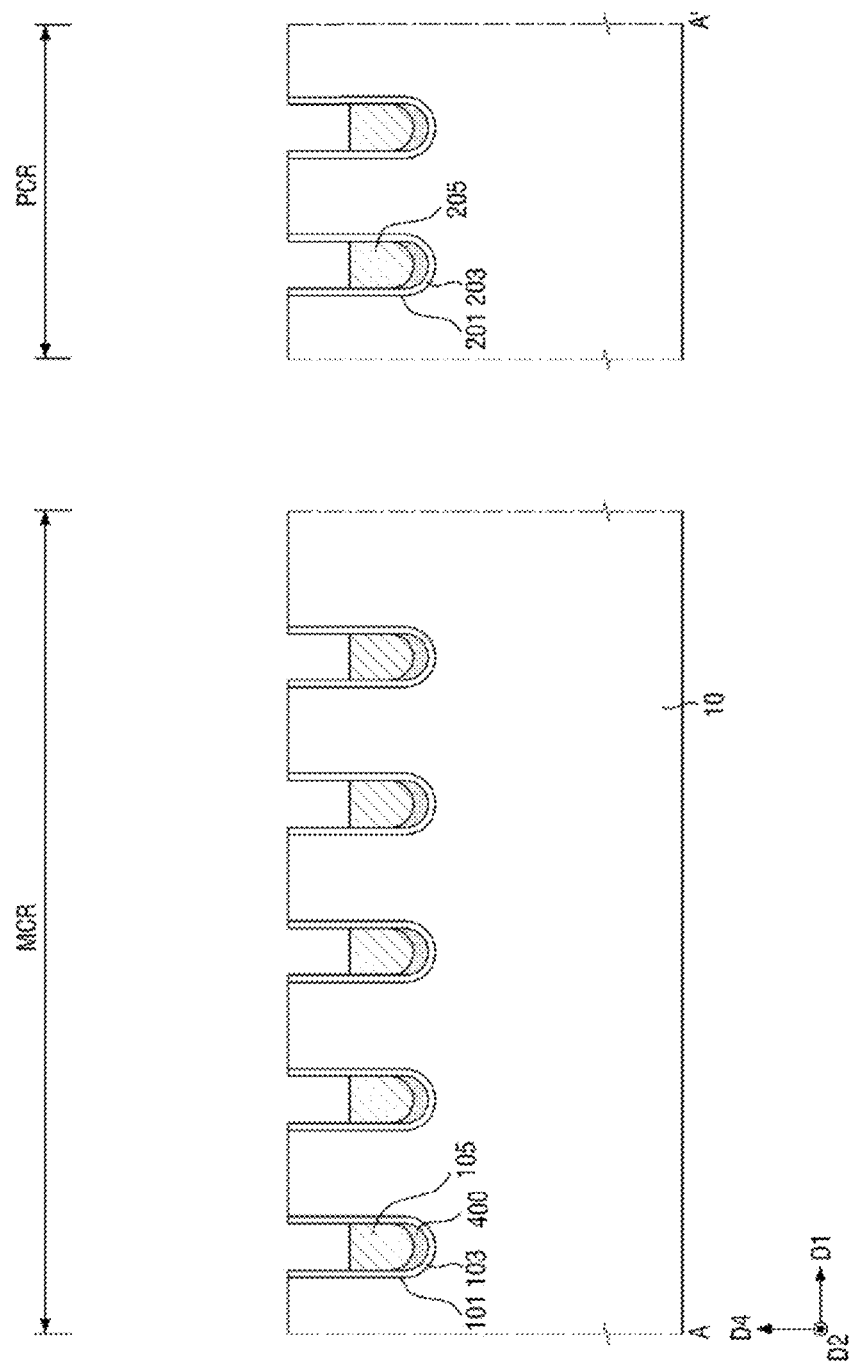

Next, referring to FIGS. 2 and 9, the inside of the gate recess 101 and the dummy trench 201 made up of the bulk tungsten (W) 105 and 205 and the nucleation tungsten (W) gas 400 is etched. The deposited nucleation tungsten (W) gas 400 may form the tungsten (W) nucleation layer. At this time, since the distribution of the ratios of the bulk tungsten (W) 105 and 205 and the nucleation tungsten (W) gas 400 forming the inside of the gate recess 101 and the dummy trench 201 is even, the metal etch back dispersion characteristics due to etching can be enhanced. For example, the uppermost part p2 of the bulk tungsten (W) 105 and the uppermost part p2 of the bulk tungsten (W) 205 in the fourth direction D4 may be formed at the same height.

In the semiconductor memory element according to an embodiment of the present disclosure, to explain enhancement in the metal etch back dispersion characteristics enhanced through the dummy pattern 200 formed in the peripheral circuit region PCR, the reason for the deterioration of the metal etch back dispersion characteristics when the dummy pattern 200 is not formed in the peripheral circuit region PCR will be explained with reference to FIGS. 10 to 18 below. For the sake of simplification of explanation, repeated explanation of aforementioned contents will not be provided.

Figure 10:
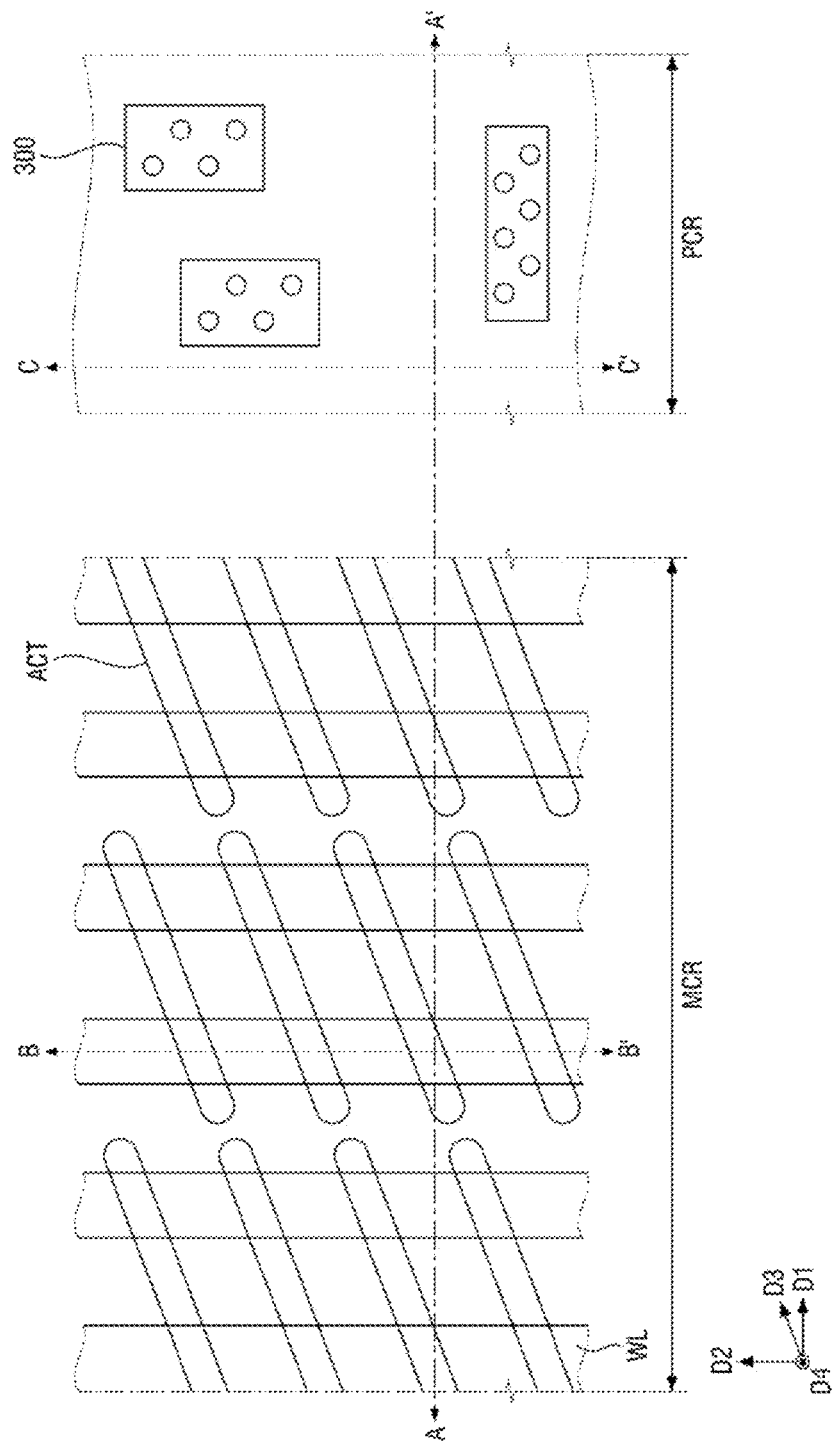
FIG. 10 is an exemplary diagram showing a semiconductor memory element including a peripheral circuit region that does not include a dummy pattern.
Figure 11:
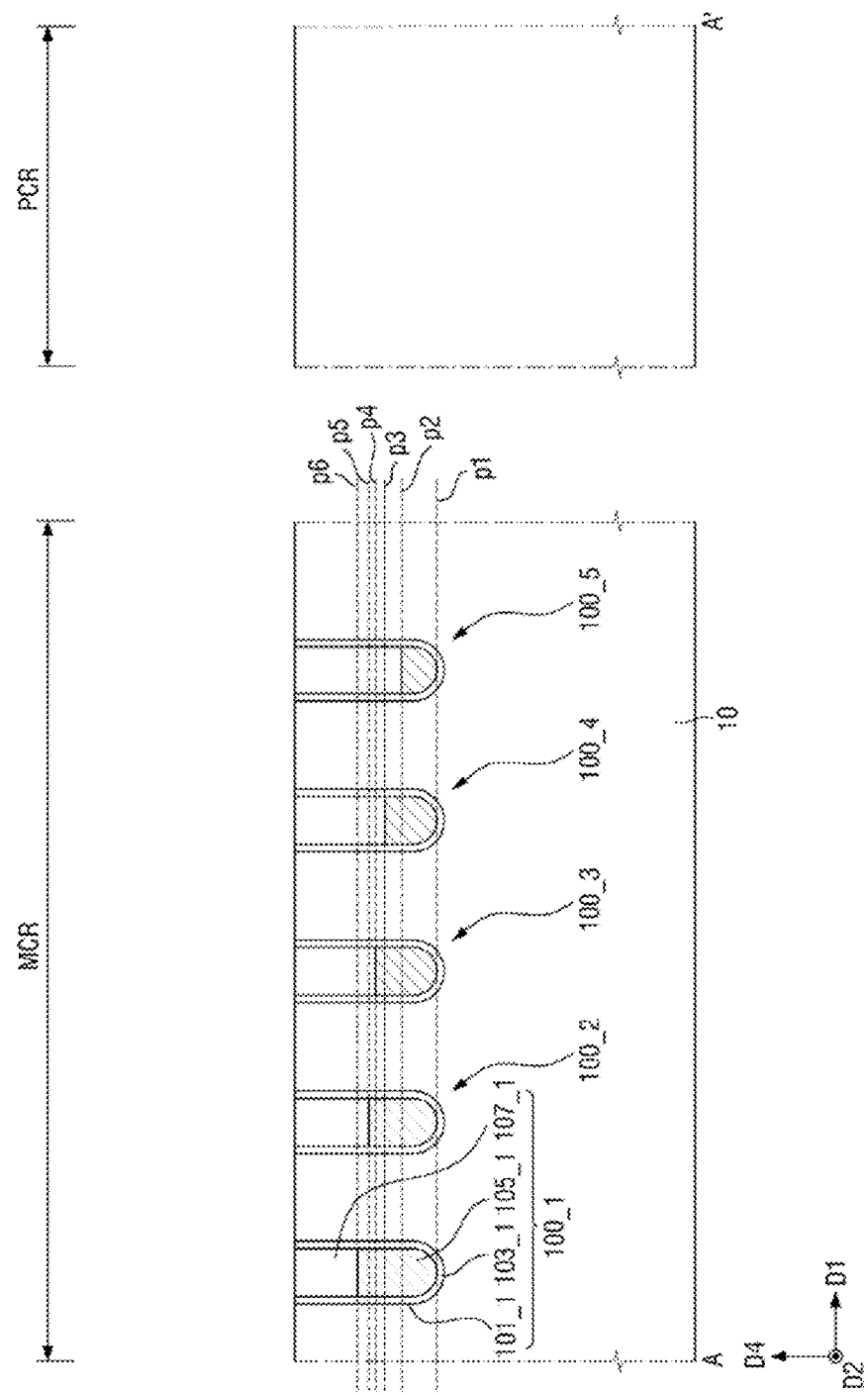
FIG. 11 is an exemplary cross-sectional view showing a cross section taken along line A-A' of FIG. 10.
Figure 12:
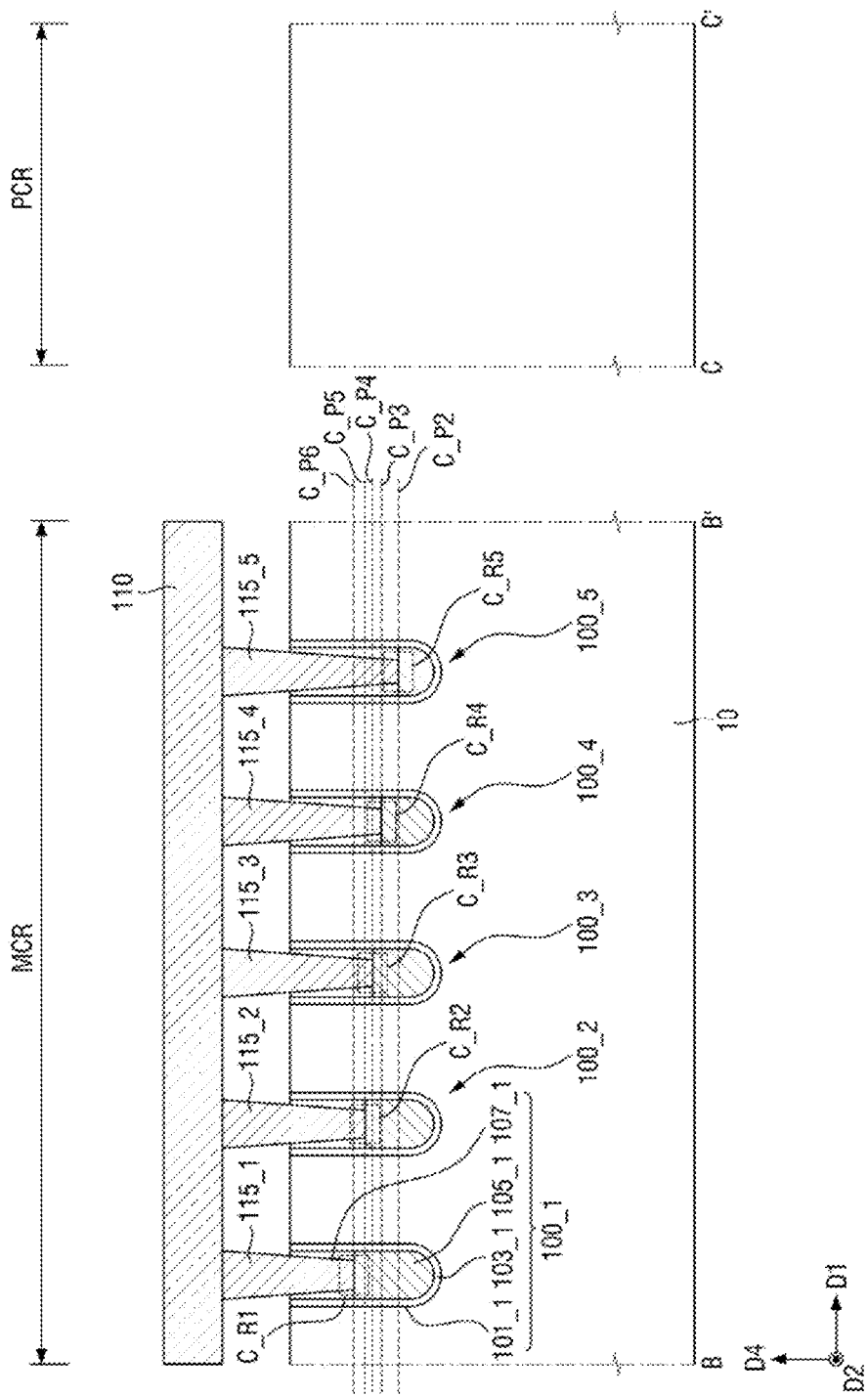
FIG. 12 is an exemplary cross-sectional view showing cross sections taken along lines B-B' and C-C' of FIG. 10.

FIG. 10 is an exemplary diagram showing a semiconductor memory element including a peripheral circuit region that does not include a dummy pattern. FIG. 11 is an exemplary cross-sectional view showing a cross section taken along line A-A' of FIG. 10. FIG. 12 is an exemplary cross-sectional view showing cross sections taken along lines B-B' and C-C' of FIG. 10.

Referring to FIGS. 10 to 12, for comparing with the semiconductor memory elements according to an embodiment of the present disclosure, a semiconductor memory element to be compared may include a substrate 10, a memory cell region MCR on the substrate 10, and a peripheral circuit region PCR on the substrate 10.

The semiconductor memory element to be compared does not include a dummy pattern in the peripheral circuit region PCR, unlike the semiconductor memory element according to an embodiment of the present disclosure. That is, the semiconductor memory element to be compared may be formed only in the first region including a plurality of peripheral elements 300 in the peripheral circuit region PCR.

When the peripheral circuit region PCR does not include the dummy pattern, the metal etch back MEB dispersion characteristics of the gate patterns 100 of the memory cell region MCR may be deteriorated. That is, the distribution of the gate electrodes 105_1 to 105_5 of the respective gate patterns 100_1 to 100_5 may not be constant.

In more detail, a length from a first point p1 to a sixth point p6 in the fourth direction of the first gate electrode 105_1 of the first gate pattern 100_1, a length from the first point p1 to a fifth point p5 in the fourth direction of the second gate electrode 105_2 of the second gate pattern 100_2, a length from the first point p1 to a fourth point p4 in the fourth direction of the third gate electrode 105_3 of the third gate pattern 100_3, a length from the first point p1 to a third point p3 in the fourth direction of the fourth gate electrode 105_4 of the fourth gate pattern 100_4, and a length from the first point p1 to a second point p2 in the fourth direction of the fifth gate electrode 105_5 of the fifth gate pattern 100_5 may be different from each other. As illustrated in FIG. 11, p1 may represent a level of the lowest ends of the first to fifth gate electrodes 105_1, 105_2, 105_3, 105_4, and 105_5 in the fourth direction D4, and p6, p5, p4, p3 and p2 may each respectively represent a level of an uppermost part of each of the first to fifth gate electrodes 105_1, 105_2, 105_3, 105_4, and 105_5 in the fourth direction D4.

As mentioned above, due to the non-uniform distribution of the respective gate electrodes 105_1 to 105_5 of the gate patterns 100_1 to 100_5, a defect or defects may occur in the contacts between the gate electrodes 105_1 to 105_5 and the conductive vias 115_1 to 115_5.

In more detail, a height in the fourth direction D4 of a first contact point C_P6 on which the first gate electrode 105_1 of the first gate pattern 100_1 is in contact with the first conductive via 115_1, a height in the fourth direction D4 of a second contact point C_P5 on which the second gate electrode 105_2 of the second gate pattern 100_2 is in contact with the second conductive via 115_2, a height in the fourth direction D4 of a third contact point C_P4 on which the third gate electrode 105_3 of the third gate pattern 100_3 is in contact with the third conductive via 115_3, a height in the fourth direction D4 of a fourth contact point C_P3 on which the fourth gate electrode 105_4 of the fourth gate pattern 100_4 is in contact with the fourth conductive via 115_4, and a height in fourth direction D4 of a fifth contact point C_P2 on which the fifth gate electrode 105_5 of the fifth gate pattern 100_5 is in contact with the fifth conductive via 115_5 may be different from each other. Referring to FIGS. 11 and 12, the first to fifth contact points C_P6, C_P5, C_P4, C_P3 and C_P2 may respectively correspond to the sixth to second points p6, p5, p4, p3 and p2.

Due to the non-uniform distribution of the gate electrodes 105_1 to 105_5 of the respective gate patterns 100_1 to 100_5, distribution of the contact resistances between the gate electrodes 105_1 to 105_5 and the conductive vias 115_1 to 115_5 may not be uniform.

This will be explained in detail referring to FIG. 13 together with FIG. 12.

Figure 13:
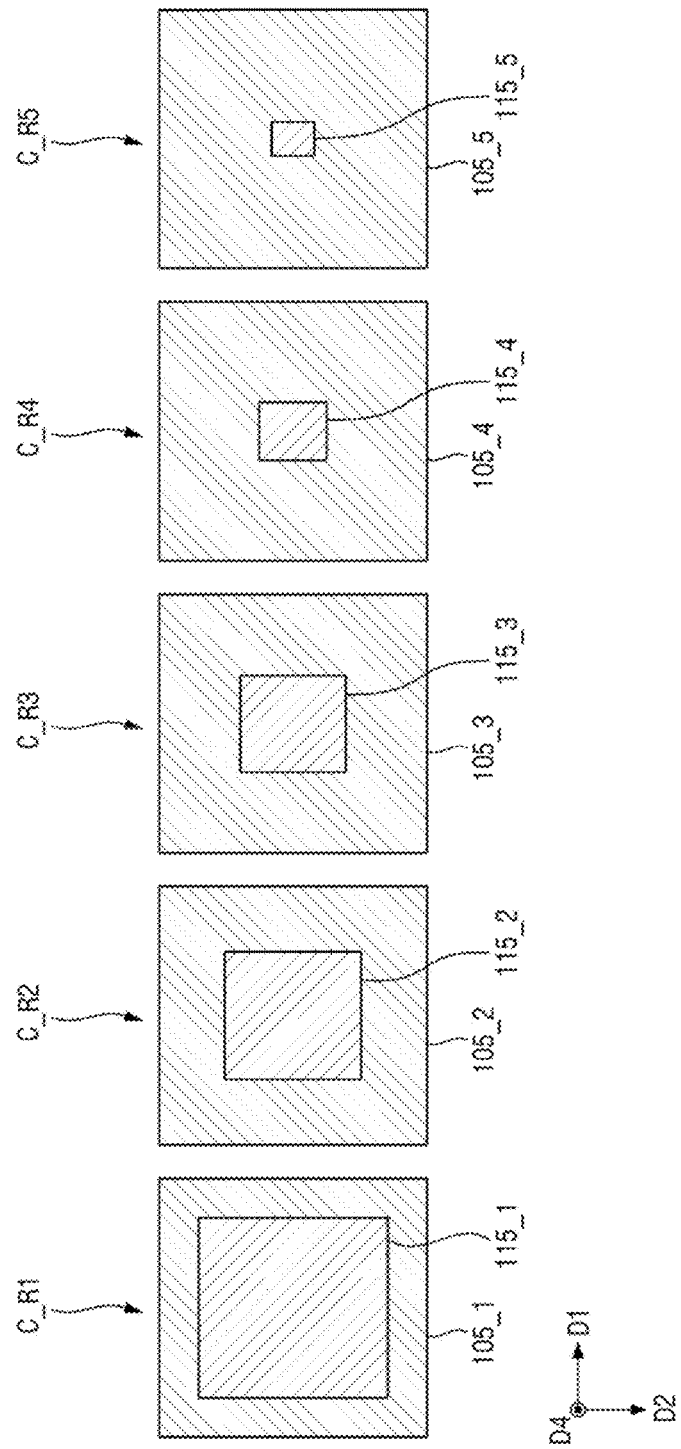
FIG. 13 is an exemplary enlarged view showing contact regions C_R1 to C_R5 of FIG. 12 in an enlarged manner.

FIG. 13 is an exemplary enlarged view showing contact regions C_R1 to C_R5 of FIG. 12 in an enlarged manner.

Referring to FIGS. 12 and 13 together, a first contact area in a first contact region C_R1 of the first contact point C_P6 on which the first gate electrode 105_1 of the first gate pattern 100_1 is in contact with the first conductive via 115_1, a second contact area in a second contact region C_R2 of the second contact point C_P5 on which the second gate electrode 105_2 of the second gate pattern 100_2 is in contact with the second conductive via 115_2, a third contact area in a third contact region C_R3 of the third contact point C_P4 on which the third gate electrode 105_3 of the third gate pattern 100_3 is in contact with the third conductive via 115_3, a fourth contact area in a fourth contact region C_R4 of the fourth contact point C_P3 on which the fourth gate electrode 105_4 of the fourth gate pattern 100_4 is in contact with the fourth conductive via 115_4, and a fifth contact area in a fifth contact region C_R5 of the fifth contact point C_P2 on which the fifth gate electrode 105_5 of the fifth gate pattern 100_5 is in contact with the fifth conductive via 115_5 may be different from each other. In an embodiment of the present disclosure, the sizes of the first to fifth contact areas may gradually decrease from the first contact area in the first contact region C_R1 to the fifth contact area in the fifth contact region C_R5. Due to the non-uniform distribution of the sizes of the first to fifth contact areas, distribution of the contact resistances between the gate electrodes 105_1 to 105_5 and the conductive vias 115_1 to 115_5 may not be uniform. For example, since the fifth contact area in the fifth contact region C_R5 has the smallest size among the first to fifth contact areas, the contact resistance between the fifth gate electrode 105_5 and the fifth conductive via 115_5 may be the highest.

There may also be a case where the fifth gate electrode 105_5 is not in contact with the fifth conductive via 115_5, unlike the fifth contact point C_P2 of FIGS. 12 and 13.

When the gate electrode is not in contact with the conductive via, a contact defect of the semiconductor memory element may occur, and the overall performance of the semiconductor memory element may be deteriorated.

A cause of occurrence of the aforementioned problem when the dummy pattern is not formed in the peripheral circuit region PCR will be explained in detail with reference to FIGS. 14 to 19 below.

FIGS. 14 to 18 are intermediate step diagrams for explaining a method for fabricating a semiconductor memory element including a peripheral circuit region that does not include a dummy pattern.

Figure 14:
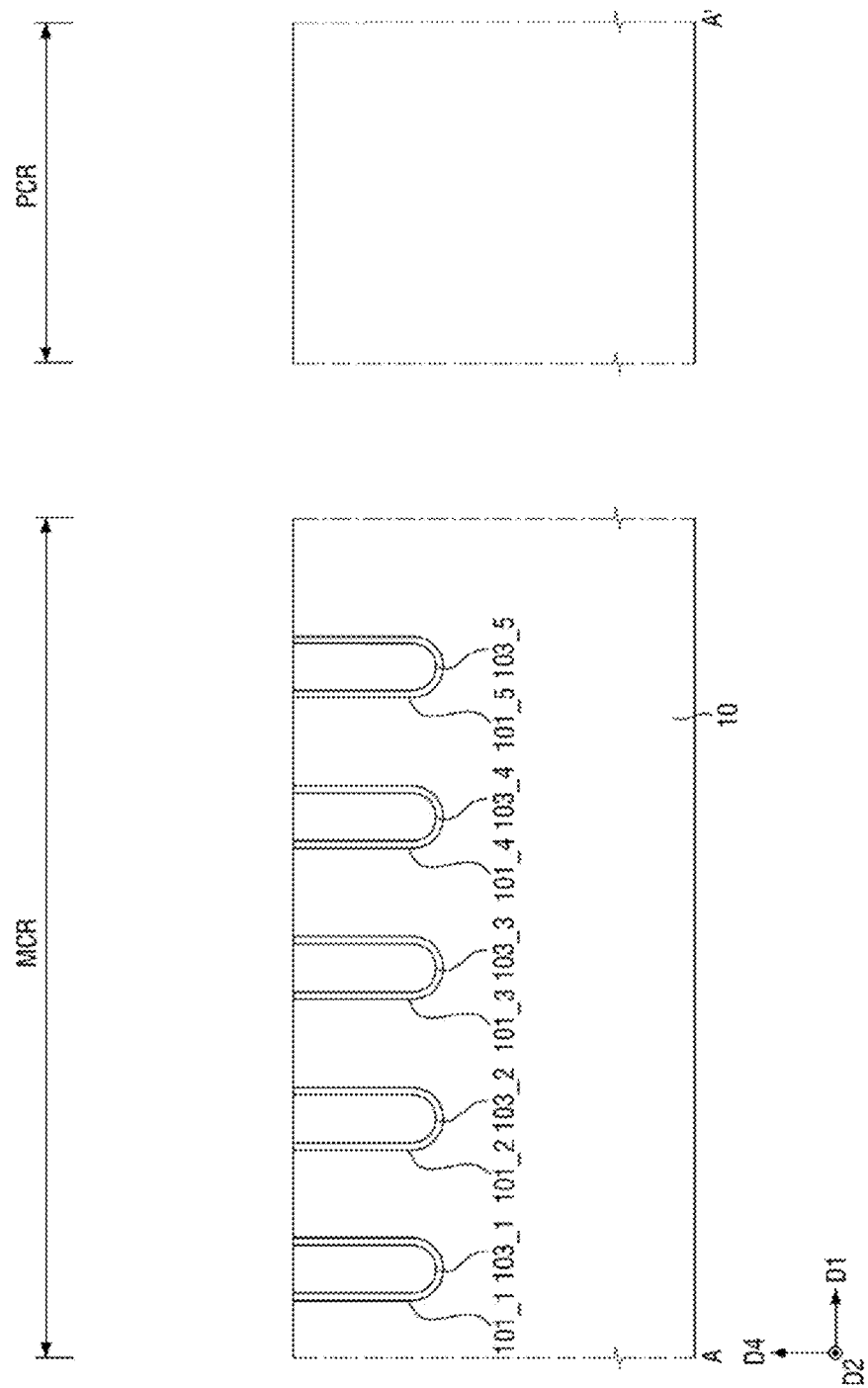
FIGS. 14 to 18 are intermediate step diagrams for explaining a method for fabricating a semiconductor memory element including a peripheral circuit region that does not include a dummy pattern.

Referring to FIG. 14, unlike FIG. 5, the semiconductor memory element to be compared does not have a dummy trench formed in the peripheral circuit region PCR.

Figure 15:
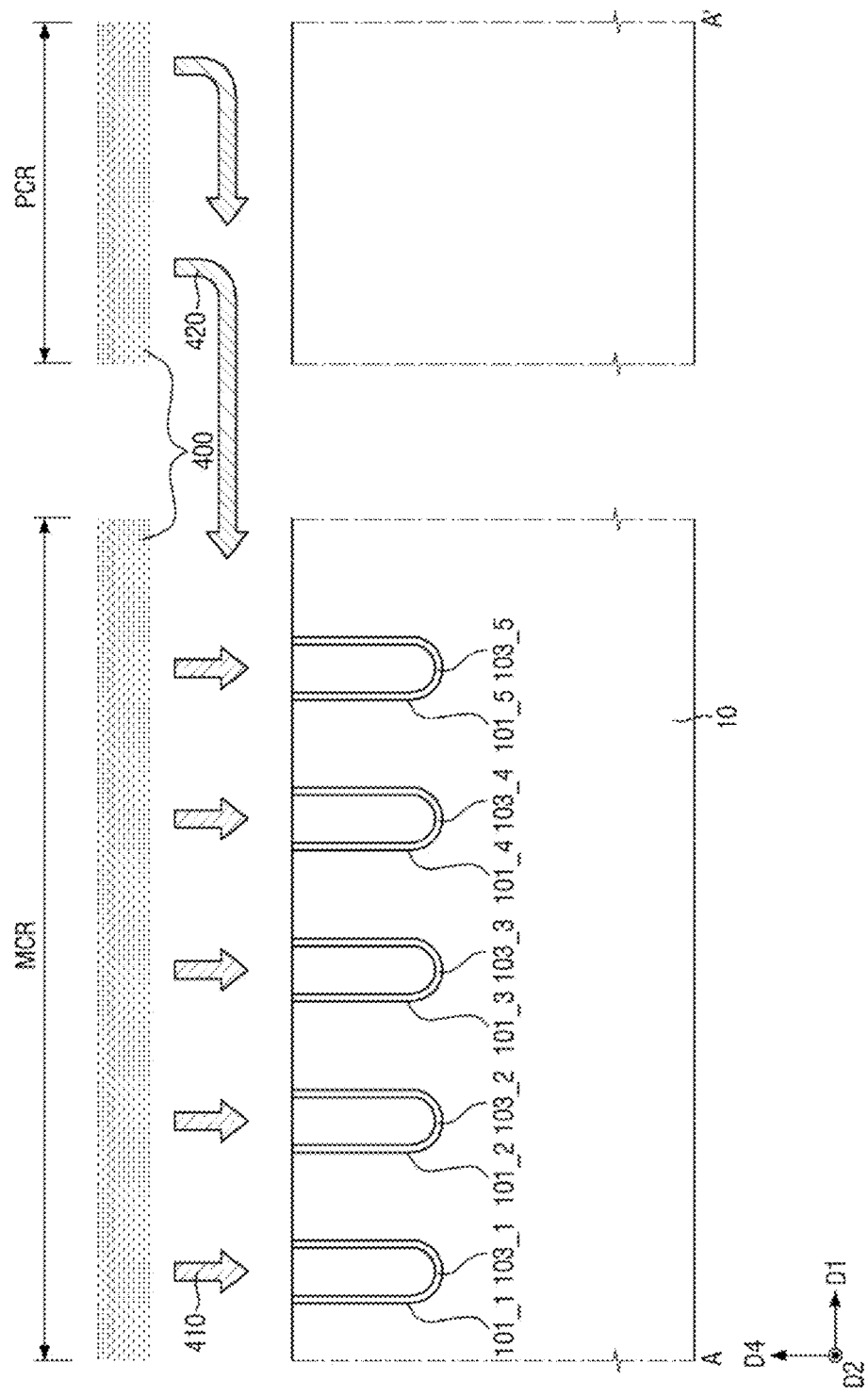

Hereinafter, referring to FIG. 15, unlike FIG. 6, because a dummy trench is not formed in the peripheral circuit region PCR of the semiconductor memory element to be compared, the nucleation gases 400 injected onto the peripheral circuit region PCR are not injected into the peripheral circuit region PCR on the substrate 10.

Since dummy trenches are not formed in the peripheral circuit region PCR, the nucleation gases 400 injected onto the peripheral circuit region PCR may be injected into the memory cell region MCR adjacent to the peripheral circuit region PCR along a route 420. At this time, because the amount of the nucleation gas 400 injected into the peripheral circuit region PCR is limited, a large amount of the nucleation gas 400 may be accumulated from the gate trenches (for example, the fifth gate trench 101_5) located adjacent to the peripheral circuit region PCR in the memory cell region MCR. A relatively smaller amount of the nucleation gas 400 may be accumulated in the gate trenches (for example, the first gate trench 101_1) located far away from the peripheral circuit region PCR in the memory cell region MCR.

Figure 16:
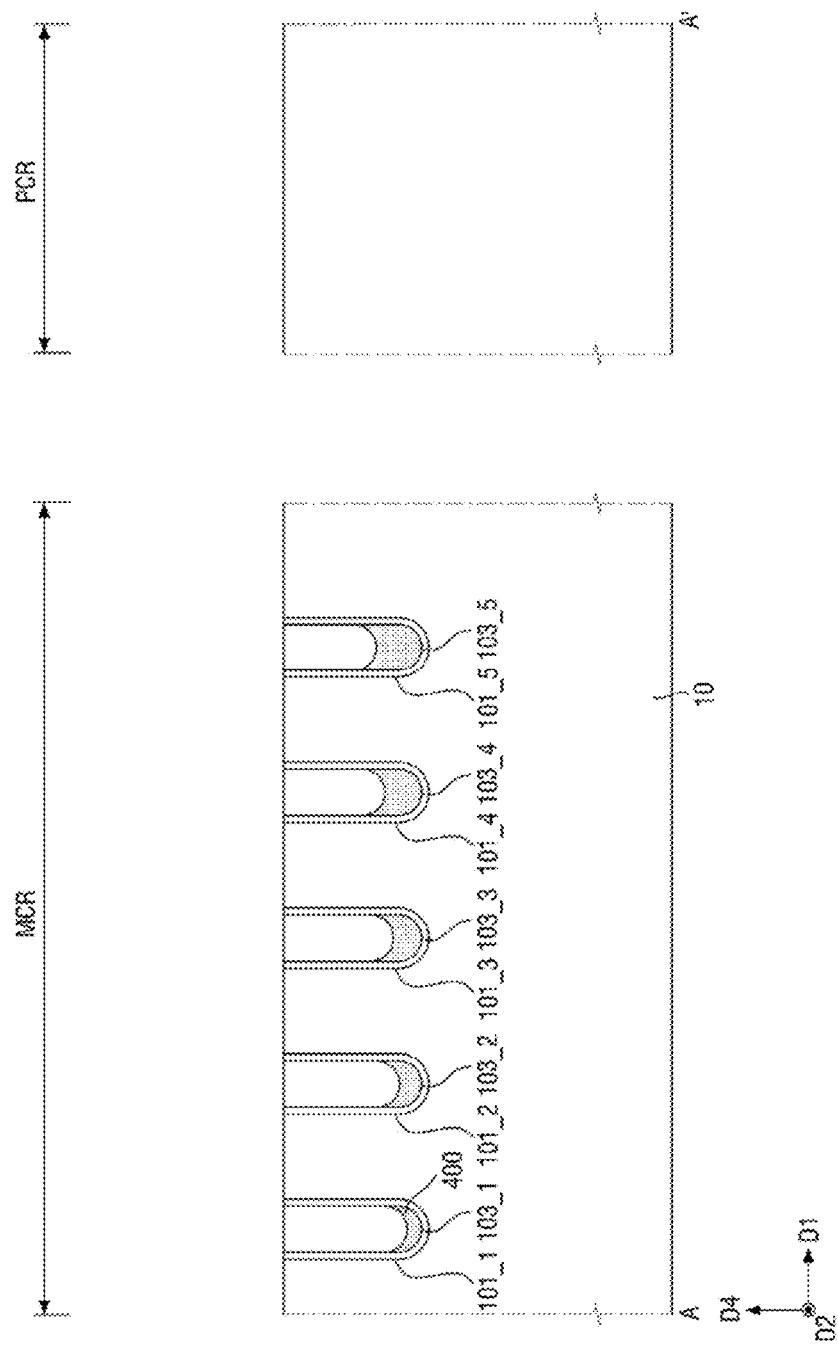

Referring to FIG. 16, the amount of nucleation gas 400 formed in the first gate trench 101_1, the amount of nucleation gas 400 formed in the second gate trench 101_2, the amount of nucleation gas 400 formed in the third gate trench 101_3, the amount of nucleation gas 400 formed in the fourth gate trench 101_4, and the amount of nucleation gas 400 formed in the fifth gate trench 101_5 may be different from each other. In an embodiment of the present disclosure, the amounts of nucleation gas 400 formed in the first gate trench 101_1 to the fifth gate trench 101_5 may gradually increase from the amount of nucleation gas 400 formed in the first gate trench 101_1 to the amount of nucleation gas 400 formed in the fifth gate trench 101_5. The deposited nucleation tungsten (W) gas 400 may form tungsten (W) nucleation layer.

Figure 17:
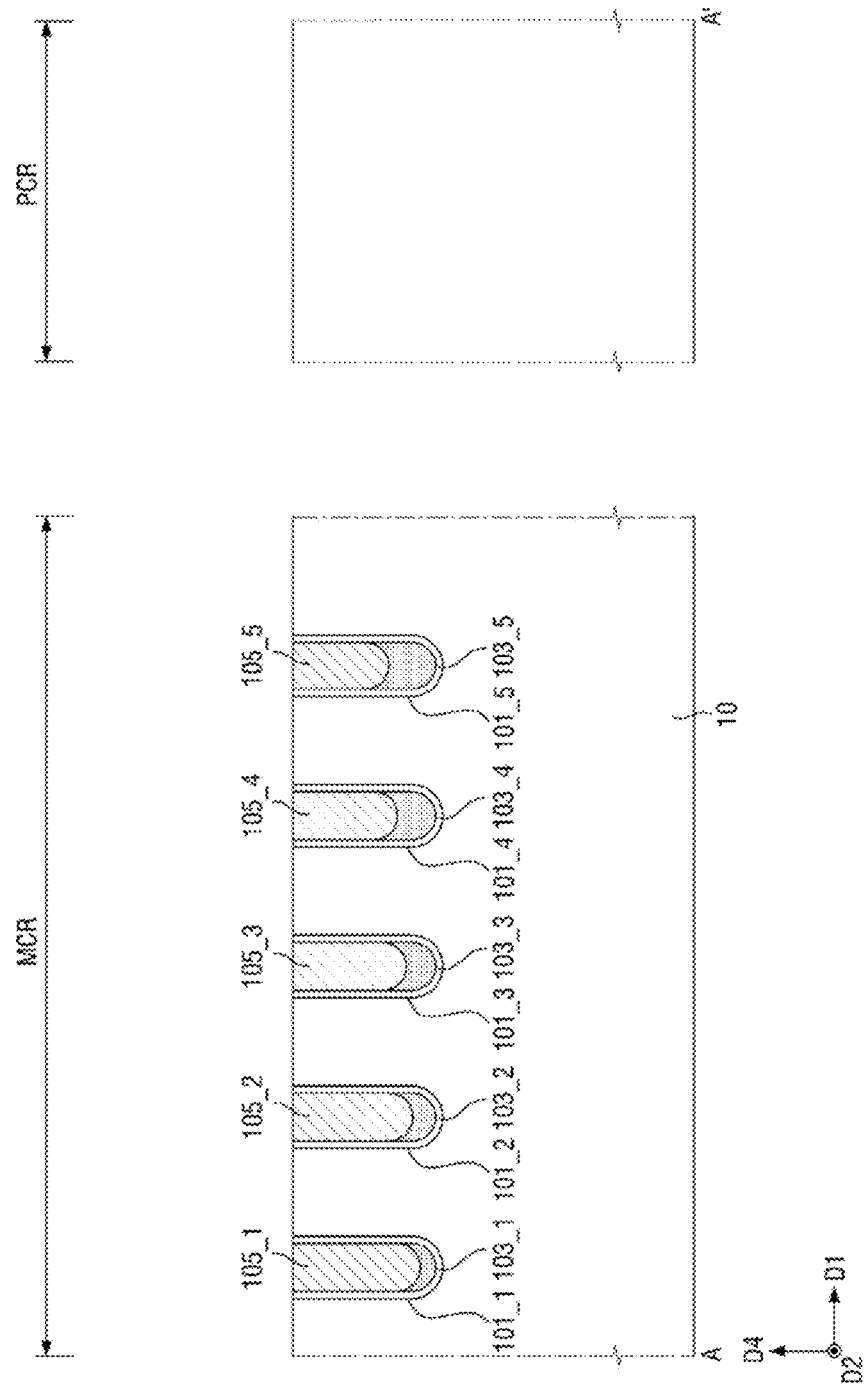

Referring to FIG. 17, due to a difference in amounts of nucleation gas 400 formed in the plurality of gate trenches 101_1 to 101_5, amounts of bulk tungsten (W) 105_1 to 105_5 formed in the plurality of gate trenches 101_1 to 101_5 may also be different from each other.

Figure 18:
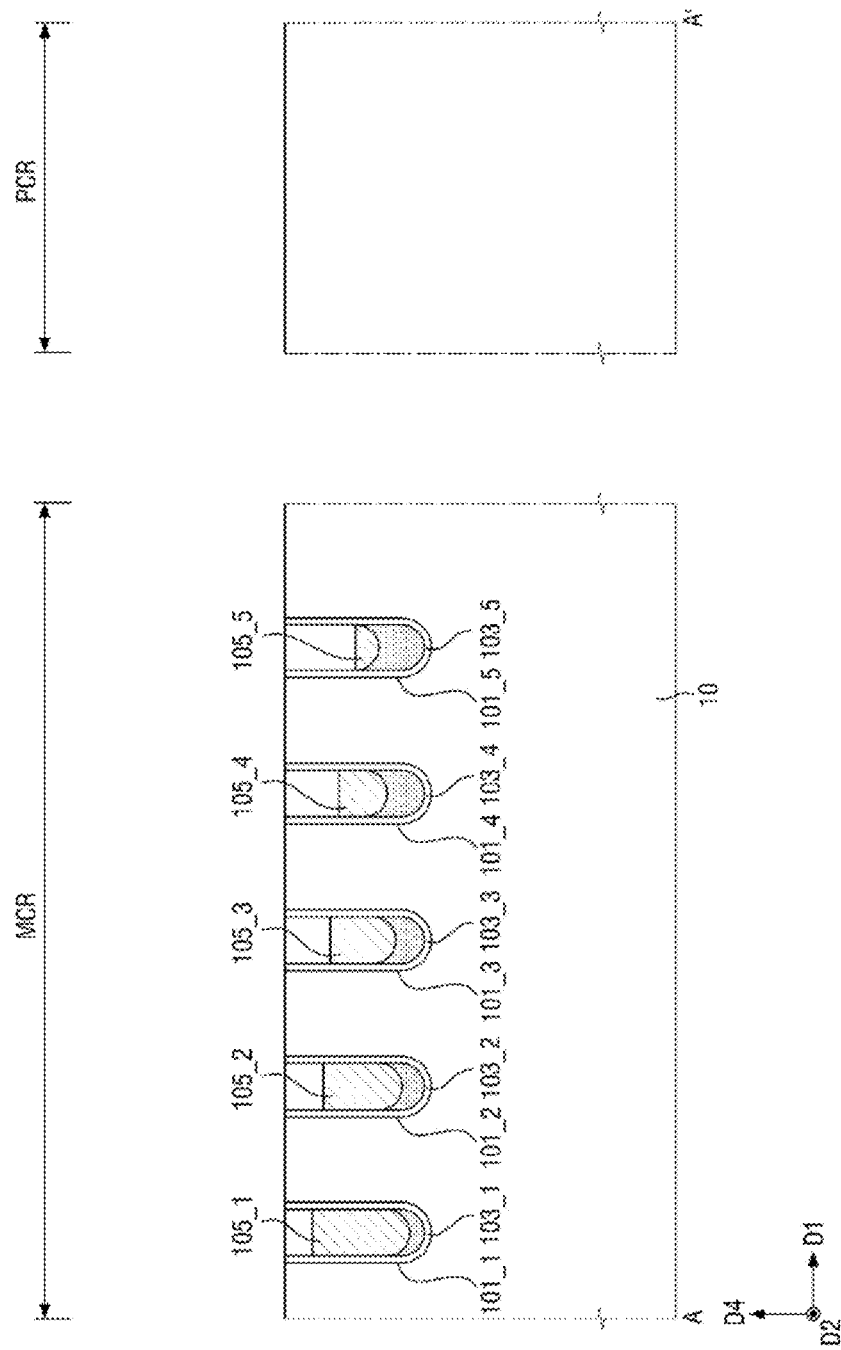

Referring to FIG. 18, due to the difference in ratios between the nucleation gas 400 and the bulk tungsten (W) 105_1 to 105_5 formed in the plurality of gate trenches 101_1 to 101_5, the etching ratios of each of the plurality of gate trenches 101_1 to 101_5 relative to the conductive materials 105_1 to 105_5 become different from each other in the etching process.

In more detail, the amount of conductive material 105_1 etched in the first gate trench 101_1, the amount of conductive material 105_2 etched in the second gate trench 101_2, the amount of conductive material 105_3 etched in the third gate trench 101_3, the amount of conductive material 105_4 etched in the fourth gate trench 101_4, and the amount of conductive material 105_5 etched in the fifth gate trench 101_5 may be different from each other. In an embodiment of the present disclosure, the amounts of the conductive material 105_1 to the conductive material 105_5 etched in the first gate trench 101_1 to the fifth gate trench 101_5 may gradually increase from the amount of the conductive material 105_1 etched in the first gate trench 101_1 to the amount of the conductive material 105_5 etched in the fifth gate trench 101_5. For example, the amount of the conductive material 105_5 being etched may be larger than the amount of the conductive material 105_1 being etched in the etching process. However, the present disclosure is not limited thereto. For example, in an embodiment of the present disclosure, the amounts of the conductive material 105_1 to the conductive material 105_5 etched in the first gate trench 101_1 to the fifth gate trench 101_5 may gradually decrease from the amount of the conductive material 105_1 etched in the first gate trench 101_1 to the amount of the conductive material 105_5 etched in the fifth gate trench 101_5.

Due to the reasons in the aforementioned process, the metal etch back dispersion characteristics of the gate electrode of the semiconductor memory element in which the dummy pattern is not formed in the peripheral circuit region PCR may be deteriorated.

The metal etch back dispersion characteristics between the semiconductor memory element having no dummy pattern formed in the peripheral circuit region PCR and the semiconductor memory element having the dummy pattern 200 formed in the peripheral circuit region PCR according to an embodiment of the present disclosure may be compared, and the comparison will be made with reference to a graph shown in FIG. 19.

Figure 19:
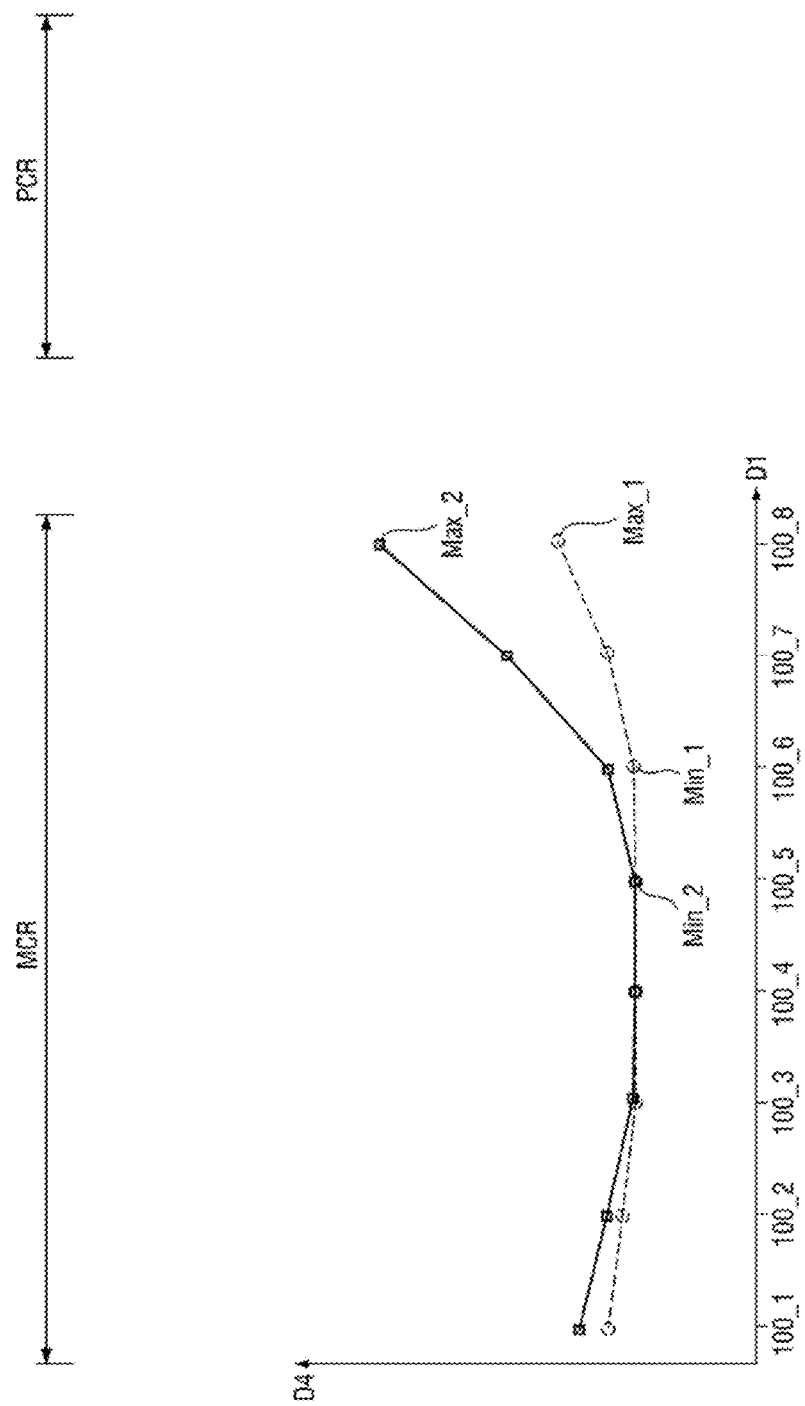
FIG. 19 is an exemplary graph in which metal etch back (MEB) dispersion characteristics of the gate patterns of memory cell region between the semiconductor memory element according to an embodiment of the present disclosure and the semiconductor memory element including the peripheral circuit region including no dummy pattern are compared.

FIG. 19 is an exemplary graph in which metal etch back (MEB) dispersion characteristics of the gate patterns of memory cell region between the semiconductor memory element according to an embodiment of the present disclosure and the semiconductor memory element including the peripheral circuit region including no dummy pattern are compared.

Referring to FIG. 19, a dotted line connected by circles in the graph shows the metal etch back dispersion of the gate patterns of the semiconductor memory element according to an embodiment of the present disclosure. A solid line connected by squares in the graph shows the metal etch back dispersion of the gate patterns of the semiconductor memory element to be compared.

An x-axis direction of the graph indicates positions of gate patterns (for example, 100_1 to 100_8) in the memory cell region MCR distributed in the first direction D1. For reference, for a clear comparison of metal etch back dispersion characteristics, the number of gate patterns shown in the graph will be explained to be greater than the number of gate patterns of FIG. 2. From the first gate pattern 100_1 to the eighth gate pattern 100_8 in the x-axis direction of the graph, it becomes closer to the peripheral circuit region PCR.

A y-axis of the graph is a length from the bottom to the top of the gate electrodes in each of the gate patterns 100_1 to 100_8 formed in the fourth direction D4.

As shown, the dispersion of the gate electrodes in the gate patterns of the semiconductor memory element according to an embodiment of the present disclosure may have a narrow dispersion from a lowest point Min_1 to a highest point Max_1.

In contrast, the dispersion of the gate electrodes in the gate patterns of the semiconductor memory element to be compared may have a very wide dispersion from a lowest point Min_2 to a highest point Max_2.

As the reasons set forth above with reference to FIG. 19, the semiconductor memory element according to an embodiment of the present disclosure may have enhanced metal etch back dispersion on the gate electrodes in the gate patterns 100_1 to 100_8 in the memory cell region MCR, by forming a dummy pattern in the peripheral circuit region PCR.

Figure 20:
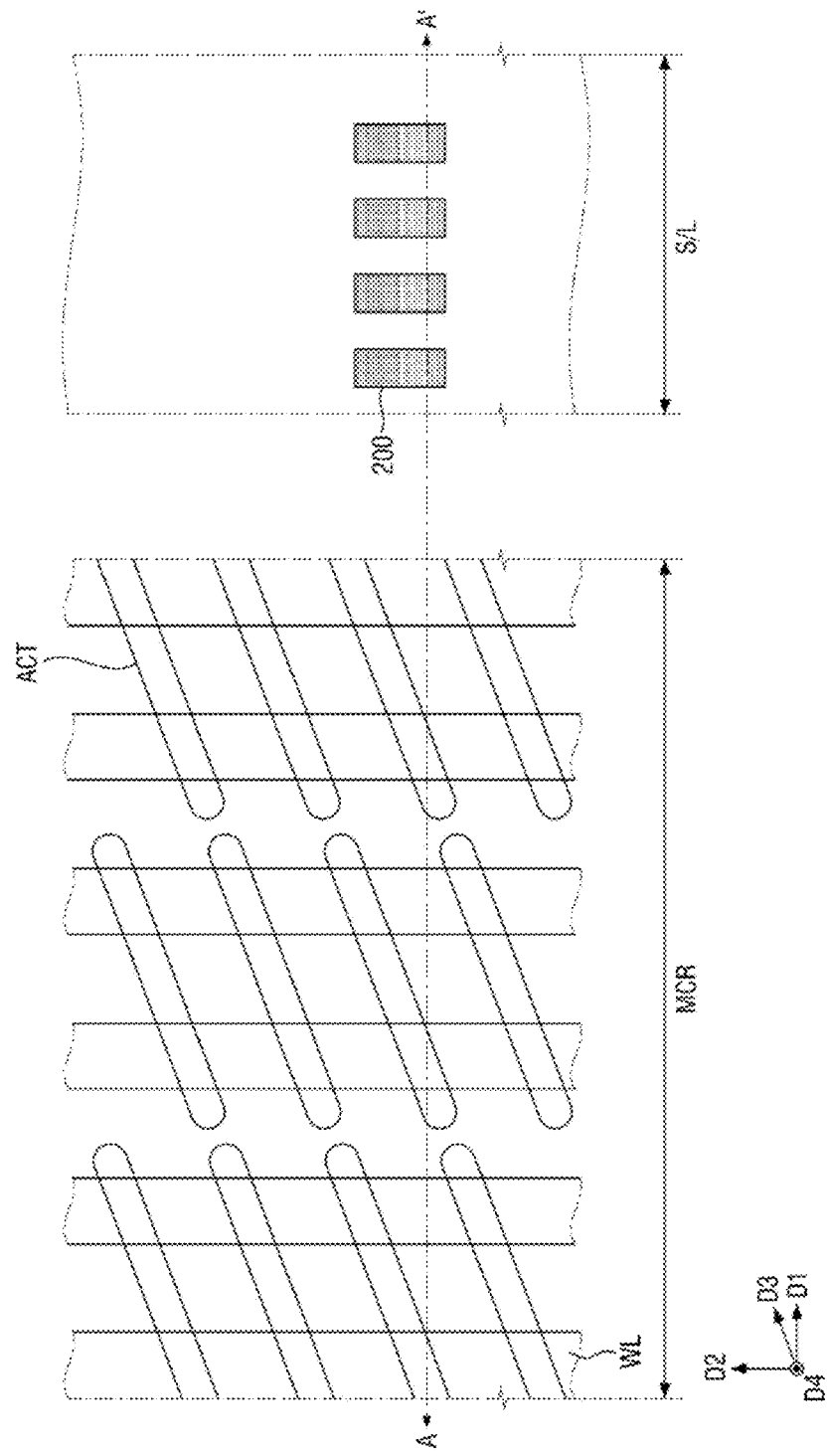
FIG. 20 is an exemplary diagram showing a memory cell region and a scribe lane of the semiconductor memory element according to an embodiment of the present disclosure.

FIG. 20 is an exemplary diagram showing a memory cell region and a scribe lane of the semiconductor memory element according to an embodiment of the present disclosure. FIG. 21 is an exemplary cross-sectional view showing a cross section taken along line A-A' of FIG. 20.

A scribe lane (S/L) for cutting between the memory cell region MCR and another memory cell region may be formed on the substrate 10. For example, the scribe lane may dividedly saw the memory cell region. For example, the substrate 10 is sawed on the scribe lane (S/L). Although the scribe lane S/L may have a shallow trench isolation (STI) structure, the structure of the scribe lane S/L is not limited thereto.

The semiconductor memory element according to an embodiment of the present disclosure may form a dummy pattern 200 in the scribe lane S/L.

The semiconductor memory element according to an embodiment of the present disclosure may form the dummy pattern 200 in the peripheral circuit region PCR, and may form the dummy pattern 200 in the scribe lane S/L, as explained with reference to FIG. 1 and FIG. 20.

Since the explanation of the semiconductor memory element according to an embodiment of the present disclosure in which the dummy pattern 200 is formed in the scribe lane S/L is similar to explanation of the semiconductor memory element according to an embodiment of the present disclosure, in which the dummy pattern 200 is formed in the peripheral circuit region PCR, the explanation thereof will not be provided.

While the present disclosure has been particularly shown and described with reference to embodiments thereof, it will be understood that various changes in form and details may be made therein without departing from the spirit and scope of the present disclosure as defined in the appended claims.

What is claimed is:

1. A semiconductor memory element comprising:
a substrate including a memory cell region and a peripheral circuit region;
an active region located in the memory cell region;
a gate pattern buried in the active region and including a gate electrode;
a conductive line disposed above the gate pattern;
a first region including a plurality of peripheral elements placed in the peripheral circuit region;
a dummy pattern buried in the peripheral circuit region;
a second region which includes the dummy pattern and does not overlap the first region; and
a conductive via disposed on the gate electrode, and connected to the gate electrode and the conductive line.

2. The semiconductor memory element of claim 1, wherein the second region is floating.

3. The semiconductor memory element of claim 1, further comprising:
a scribe lane on which the substrate is sawed.

4. The semiconductor memory element of claim 3, wherein the scribe lane has an STI structure.

5. The semiconductor memory element of claim 3, wherein the dummy pattern is formed in the scribe lane.

6. The semiconductor memory element of claim 1, wherein an area of the second region is larger than an area of the first region.

7. A semiconductor memory element comprising:
a substrate which includes a memory cell region including a plurality of gate trenches, and a peripheral circuit region including a plurality of dummy trenches;
a plurality of peripheral elements which are placed in the peripheral circuit region and do not overlap the plurality of dummy trenches;
a plurality of gate patterns formed by filling the plurality of gate trenches with a metal material;
a plurality of conductive vias respectively connected to the gate patterns; and
a plurality of dummy patterns formed by filling the plurality of dummy trenches with the metal material,
wherein lengths, which are each from a bottom to a top of a structure formed of the metal material within the gate patterns in a first direction, are the same,
heights in the first direction of contact points on which the gate patterns and the conductive vias are respectively in contact with each other are the same, and
the dummy patterns are floating.

8. The semiconductor memory element of claim 7, wherein an area occupied by the dummy patterns is larger than an area occupied by the plurality of peripheral elements.

9. The semiconductor memory element of claim 7, further comprising:
a scribe lane on which the substrate is sawed.

10. The semiconductor memory element of claim 9, wherein the scribe lane has an STI structure.

11. The semiconductor memory element of claim 9, wherein the dummy patterns are formed in the scribe lane.

12. The semiconductor memory element of claim 7, wherein contact areas on which the gate patterns and the conductive vias are respectively in contact with each other are the same.

13. A semiconductor memory element comprising:
a memory cell region including gate recesses placed continuously in a first direction;
a peripheral circuit region including a dummy pattern region including a plurality of trenches placed continuously in the first direction;
a plurality of peripheral elements placed in the peripheral circuit region;
gate insulating films formed on the gate recesses and the trenches;
gate patterns formed by forming a conductive material on the gate insulating films and filling the gate recesses; and
dummy patterns formed by forming the conductive material on the gate insulating films and filling the plurality of trenches,
wherein the gate patterns are connected to a conductive line,
the dummy patterns are floating, and
the dummy pattern region is placed apart from the memory cell region in the first direction.

14. The semiconductor memory element of claim 13, wherein the plurality of peripheral elements and the dummy pattern region do not overlap each other.

15. The semiconductor memory element of claim 13, wherein an area of the plurality of peripheral elements is smaller than an area occupied by the dummy pattern region.

16. The semiconductor memory element of claim 13, further comprising:
a scribe lane which dividedly saws the memory cell region.

17. The semiconductor memory element of claim 16, wherein the scribe lane has an STI structure.

18. The semiconductor memory element of claim 16, wherein the dummy patterns are formed in the scribe lane.

19. The semiconductor memory element of claim 13, further comprising:
conductive vias which connect the conductive line and the gate patterns,
wherein heights of contact points on which the conductive vias and the gate patterns are respectively in contact with each other in a second direction intersecting the first direction are the same.

20. The semiconductor memory element of claim 19, wherein contact areas on which the conductive vias and the gate patterns are respectively in contact with each other are the same.

* * * * *